US006982556B2

(12) United States Patent
Chung

(10) Patent No.: US 6,982,556 B2
(45) Date of Patent: Jan. 3, 2006

(54) SYSTEM AND METHOD FOR CLASSIFYING DEFECTS IN AND IDENTIFYING PROCESS PROBLEMS FOR AN ELECTRICAL CIRCUIT

(75) Inventor: Kyo Young Chung, San Jose, CA (US)

(73) Assignee: YieldBoost Tech, Inc., San Jose, CA (US)

( * ) Notice: Subject to any disclaimer, the term of this patent is extended or adjusted under 35 U.S.C. 154(b) by 27 days.

(21) Appl. No.: 10/646,688

(22) Filed: Aug. 25, 2003

(65) Prior Publication Data

US 2005/0001646 A1 Jan. 6, 2005

Related U.S. Application Data

(63) Continuation-in-part of application No. 10/455,359, filed on Jun. 6, 2003.

(51) Int. Cl.
*G01R 31/08* (2006.01)

(52) U.S. Cl. .......................................... 324/527; 324/528

(58) Field of Classification Search ................. 324/527, 324/528, 763, 765, 770, 537, 158.1; 702/35
See application file for complete search history.

(56) References Cited

U.S. PATENT DOCUMENTS 5,377,030 A * 12/1994 Suzuki et al. ............... 349/187
5,546,013 A * 8/1996 Ichioka et al. .............. 324/770
5,801,965 A * 9/1998 Takagi et al. ................. 702/35

* cited by examiner

*Primary Examiner*—Vincent Q. Nguyen
(74) *Attorney, Agent, or Firm*—Fleshner & Kim, LLP

(57) ABSTRACT

A method for performing circuit defect analysis and process problem identification includes applying a test signal to a circuit, obtaining a signal generated in response to the test signal, comparing the response signal to reference information, classifying a defect in the circuit based on a result of the comparing step, and identifying a problem in a manufacturing process which caused the defect based on the classification. The reference information may include one or more signal profiles corresponding to predefined types of defects that can occur during the manufacturing process. Defect classification is preferably performed by determining whether the response signal falls within one or more of the signal profiles. If the response signal falls within two or more signal profiles, then probabilities may be determined for each profile. The defect may then be classified as corresponding to the defect type whose signal profile has the highest probability. A processing system performs defect classification and process problem identification using a similar approach.

45 Claims, 17 Drawing Sheets

Gate to common short defects in TFT array with double common line layout.

Explanation of pixel layout by showing four pixels in different process step.

Simplified equivalent circuit of one cross point in TFT array

Signal patterns to detect the short defect between gate and common lines.

Signal patterns for positive pixel voltage

Signal patterns for negative pixel voltage

Analysis of pixel voltages along the gate line with a short defect between gate and self-common lines when the signal patterns of Fig. 4 (a) is applied.

Analysis of pixel voltages along the gate line with a short defect between gate and self-common lines when the signal patterns of FIG. 4 (b) is applied.

Analysis of pixel voltages along the gate line with a short defect between gate and adjacent-common lines when the signal patterns of FIG. 4 (b) is applied.

Defect Histogram that was obtained using ideal distribution of defect signals for defects d1, d2, and dn, where Vd1, Vd2, and Vdn are the representative defect signals for d1, d2 and dn, respectively, and the defect signal zones for the defects d1, d2 and dn.

Realistic distribution of the defect signals for the defects d1, d2 and dn, where normal distribution function is used for each defect type.

Explanation of pixel layout by showing four pixels in different process step.

SYSTEM AND METHOD FOR CLASSIFYING DEFECTS IN AND IDENTIFYING PROCESS PROBLEMS FOR AN ELECTRICAL CIRCUIT

This application is a continuation-in-part of application Ser. No. 10/455,359 filed Jun. 6, 2003, in contents in which are incorporated in reference herein.

BACKGROUND OF THE INVENTION

1. Field of the Invention

This invention generally relates to testing electrical circuits, and more particularly to a system and method for detecting and classifying defects in an electrical circuit during or after a manufacturing process. The present invention is also a system and method for identifying one or more process problems that caused the defects detected during a test.

2. Description of the Related Art

Because of their small size and superior performance, thin-film-transistor (TFT) arrays have evolved as a preferred technology for a variety of applications including but not limited to flat-panel LCD displays and imaging and sensing systems used in consumer electronics.

During the manufacturing process, defects may develop which, is left unaddressed, may diminish the performance of the array. These defects include electrical shorts between the gate and common lines connecting the transistors and their associated storage elements. The need to test for defects becomes more important as the number of transistors in the array increases. This may be attributable to several factors. One is that the probability of a short developing tends to vary linearly with the length of the gate and common lines. The number of these lines and their proximity to one another also plays a role in increasing the chances of a short occurring. For example, in a double-gate or double-common-line configuration, the gap between the gate and common lines is likely to be narrower than in single-gate-line and single-common-line layouts. The likelihood of a short developing consequently increases.

Once a short has been located in a TFT array, it can be repaired by cutting the short. Existing methods for locating shorts and other defects in transistor arrays, however, have proven to be inaccurate. This is especially true of shorts between the gate and common lines of the array, as this type of defect does not give off a distinctive signal at the affected pixel location which can be detected by existing methods. As a result, the defect may never be located or at best may only be detected to lie within a certain general area which includes other pixel elements that are properly functioning. Because of this imprecision, the defect may not be able to be corrected because it cannot be located with any degree of accuracy. In a worst case, an attempt to eliminate the defect may result in destroying a properly functioning portion of the array, thereby compounding the problem and in many cases tendering the transistor array unusable for all intents and purposes.

In view of the foregoing considerations, it is apparent that there is a need for a system and method for, first, detecting the existence of a defect in a thin-film-transistor array and, second, accurately detecting a location of the defect so that corrective action may be taken without disturbing other portions of the array that are properly functioning.

SUMMARY OF THE INVENTION

An object of the present invention is to improve the accuracy and efficiency of testing of electronic circuits including ones containing transistor arrays.

Another object of the present invention is to provide a system and method for accurately detecting defects in a transistor array including but not limited to a thin film transistor array.

Another object of the present invention is to provide a system and method for determining a type of defect in a transistor array.

Another object of the present invention is to provide a system and method for precisely determining a location of a defect in a transistor array during a testing procedure.

Another object of the present invention is to provide a system and method for classifying defects in a circuit under test and then to identify one or more problems that occurred in a manufacturing process that caused or likely caused the defects.

Another object of the present invention is to provide a system and method as described above which accurately performs defect classification and process problem identification while taking noise and other external influences into consideration.

These and other objects and advantages of the present invention are achieved by providing a method for detecting a defect in a transistor array which in accordance with one embodiment includes applying a test signal to the array, monitoring pixel voltage along a gate line of the array, and detecting a defect associated with the gate line based on a variation in the pixel voltage during the monitoring step. The defect may be a short between the gate line and a common line of the array. The gate line and common line may be associated with a same pixel element or different pixel elements. The method further includes detecting a location of the defect based on a rate of change in the variation of the pixel voltage along the gate line. The rate of change may be measured in any one of a variety of ways. For example, the rate of change may be measured as a sudden increase or decrease of the pixel voltage or as a change in slope of a pixel voltage profile. Alternatively, the location of the defect may corresponds to the pixel voltage hitting a minimum or maximum value as determined by a set of profile curves plotted by a signal analyzer connected to the transistor array. The transistor array may be a TFT array or another type of circuit which includes an array of transistors connected, for example, in a matrix pattern.

In accordance with another embodiment, the present invention is a system for detecting a defect in a transistor array. The system includes a signal generator for applying a test signal to the array and a detector for detecting a defect in the array based on a variation in pixel voltage along an array gate line. The defect may be a short between the gate line and a common line of the array. The gate line and common line may be associated with a same pixel element or different pixel elements. The detector further detects a location of the defect based on a rate of change in the variation of the pixel voltage along the gate line. The rate of change may be measured in any one of a variety of ways. For example, the rate of change may be measured as a sudden increase or decrease of the pixel voltage or as a change in slope of a pixel voltage profile. Further, the location of the defect may correspond to the pixel voltage hitting a minimum or maximum value as determined by a set of profile curves plotted by a signal analyzer connected to the transistor array.

In accordance with another embodiment, the present invention is a signal analyzer for testing a TFT array. The signal analyzer includes at least one electrode for inputting a test signal into the TFT array and a processor which monitors a variation in pixel voltage along a gate line of the array and detects a defect associated with the gate line based on the pixel voltage variation. The signal analyzer may detect any of the types of defects previously mentioned, using one or more of the previously mentioned techniques.

The present invention is also a system and method for performing circuit defect analysis and process problem identification. One embodiment of the method includes applying a test signal to a circuit, obtaining a signal generated in response to the test signal, comparing the response signal to reference information, classifying a defect in the circuit based on a result of the comparing step, and identifying a problem in a manufacturing process which caused the defect based on the classification. The reference information may include one or more signal profiles corresponding to predefined types of defects that can occur during the manufacturing process. The signal profiles are preferably generated based on past test data taken over a period of time. If desired, the profiles may be processed into a statistical representation of their corresponding defect types.

Defect classification is preferably performed by determining whether the response signal falls within one or more of the signal profiles. If a clear correspondence to one profile exists, then the circuit is identified as including the predefined defect type corresponding to that signal profile. If the response signal falls within two or more signal profiles, then probabilities may be determined for each profile. The defect may then be classified as corresponding to the defect type whose signal profile has the highest probability. The probabilities may be computed mathematically or logically using any one of a variety of techniques. During the comparison step, a determination may be made as to whether the response signal falls within predetermined signal zones assigned to each signal profile. The defect may then be classified based on whether the response signal falls within any one of those zones. If the profiles in adjacent zones overlay, a dividing line between the zone may be adjusted to ensure that an equal error distribution exists for the profiles in those zones.

Process problem identification is preferably performed by comparing the classified defect to stored information. This information may include a table linking the predefined types of defects to one or more process problems. By looking up the classified defect in the table, a determination can be made as to what problem occurred during the manufacturing process that caused the defect. The problem identification can then serve as feedback information for purposes of adjusting the process to eliminate the problem. In one exemplary application, the method of the present invention classifies defects and identifies process problems for TFT arrays of the type used, for example, in a display panel. In this case, the response signals correspond to pixel voltages detected in response to the input of test signals.

An embodiment of the system of the present invention for performing defect analysis includes a signal generator which applies a test signal to a circuit, a detector which obtains a signal generated in response to the test signal, and a processor which compares the response signal to reference information, classifies a defect in the circuit based on a result of the comparison, and identifies a problem in a manufacturing process which caused the defect based on the classification.

DESCRIPTION OF THE PREFERRED EMBODIMENTS

The present invention relates to a system and method for detecting a defect in an electronic circuit containing an array of transistors, and then accurately determining a location of the defect so that corrective action may be taken without disturbing other portions of the circuit that are properly functioning. The system and method are particularly well suited to detecting shorts that form between signal-carrying lines during the manufacturing process. The signal-carrying lines include but are not limited to gate lines and common lines, however the detection of defects of in other portions of the circuit is also possible. For example, the present invention may be implemented to detect at least the following types of opens and shorts: gate line open, common line open, local drain electrode open, local source electrode open, local gate electrode open, local gate-drain short, local gate-source short, local drain-source short, ITO pixel electrode-gate line short, ITO pixel electrode-data line short, Cst short through the insulator between ITO pixel electrode and common line metal, a pinhole in a gate insulator, a gate-to-data line short, and data line-to-common line short.

Additional defects which are detectable by the present invention in circuits having transistor arrays include local semiconductor island missing, local contact layer (such as n+ layer) absence, damaged Cst electrode, data-data line short, local n+ layer short, ITO-ITO short over data line, ITO-ITO short over gate line, a partial ITO pixel electrode absence, partial overlap between data line and ITO pixel electrode without short, and a partial overlap between gate line and ITO pixel electrode without short.

The present invention is ideally suited for use in detecting the existence and then determining with pinpoint accuracy the location of shorts in a TFT array used in a display such as a flat-panel LCD display. The invention, however, is not intended to be limited to this specific transistor-array application. On the contrary, the system and method of the present invention may advantageously be used to determine the existence and location of defects in TFT arrays used in virtually any other application. For convenience purposes, the remaining portion of this disclosure addresses the application of a TFT array in a display panel.

Figure 1A:
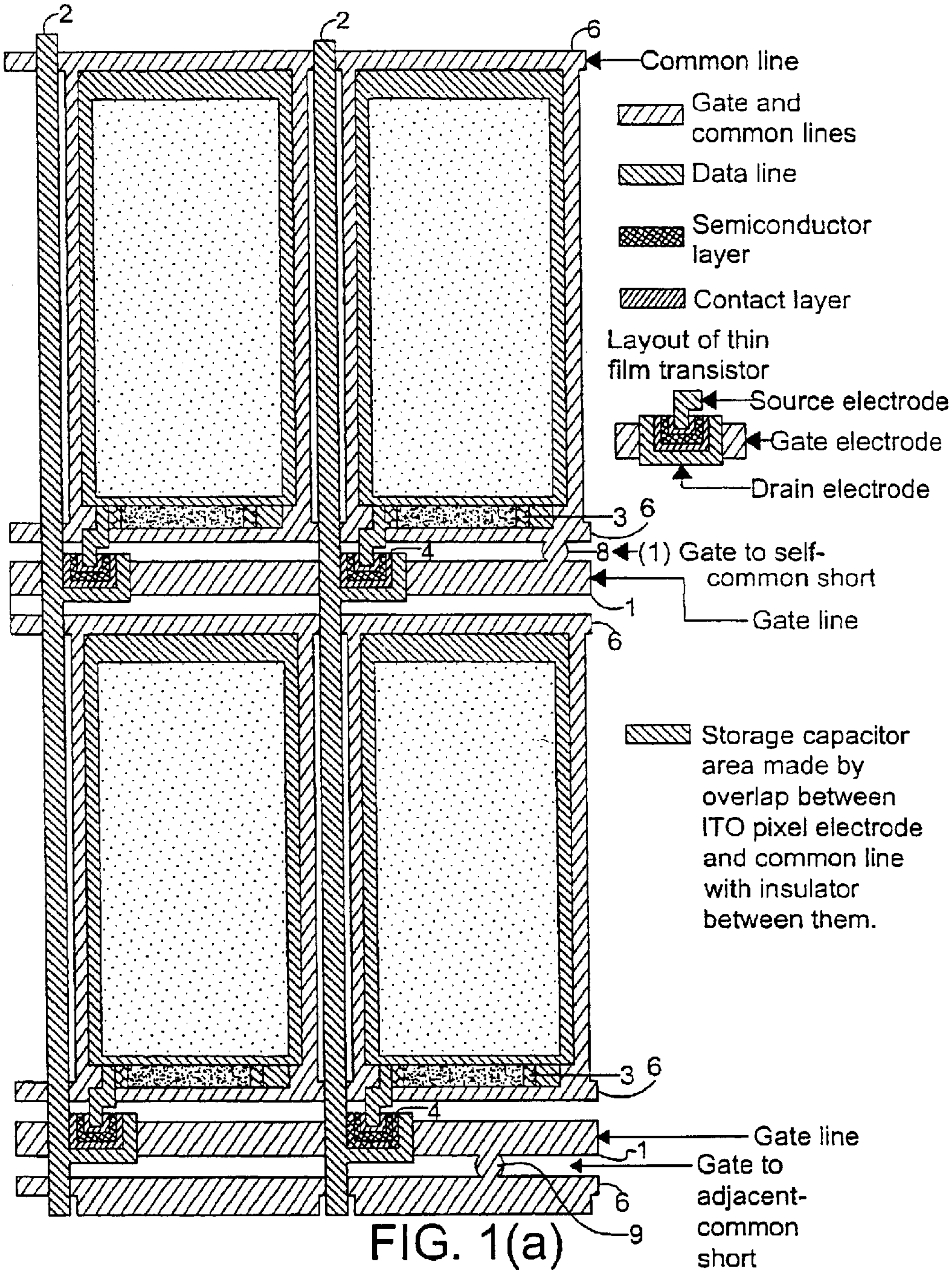
FIG. 1(*a*) is a diagram showing a portion of a thin-film-transistor array that includes elements for controlling the illumination of four corresponding pixel locations in a flat-panel LCD display screen and two types of gate-to-common short defects in TFT array, and FIG. 1(*b*) is a diagram showing the pixel layout in different process steps of the TFT array of FIG. 1(*a*).
Figure 1B:
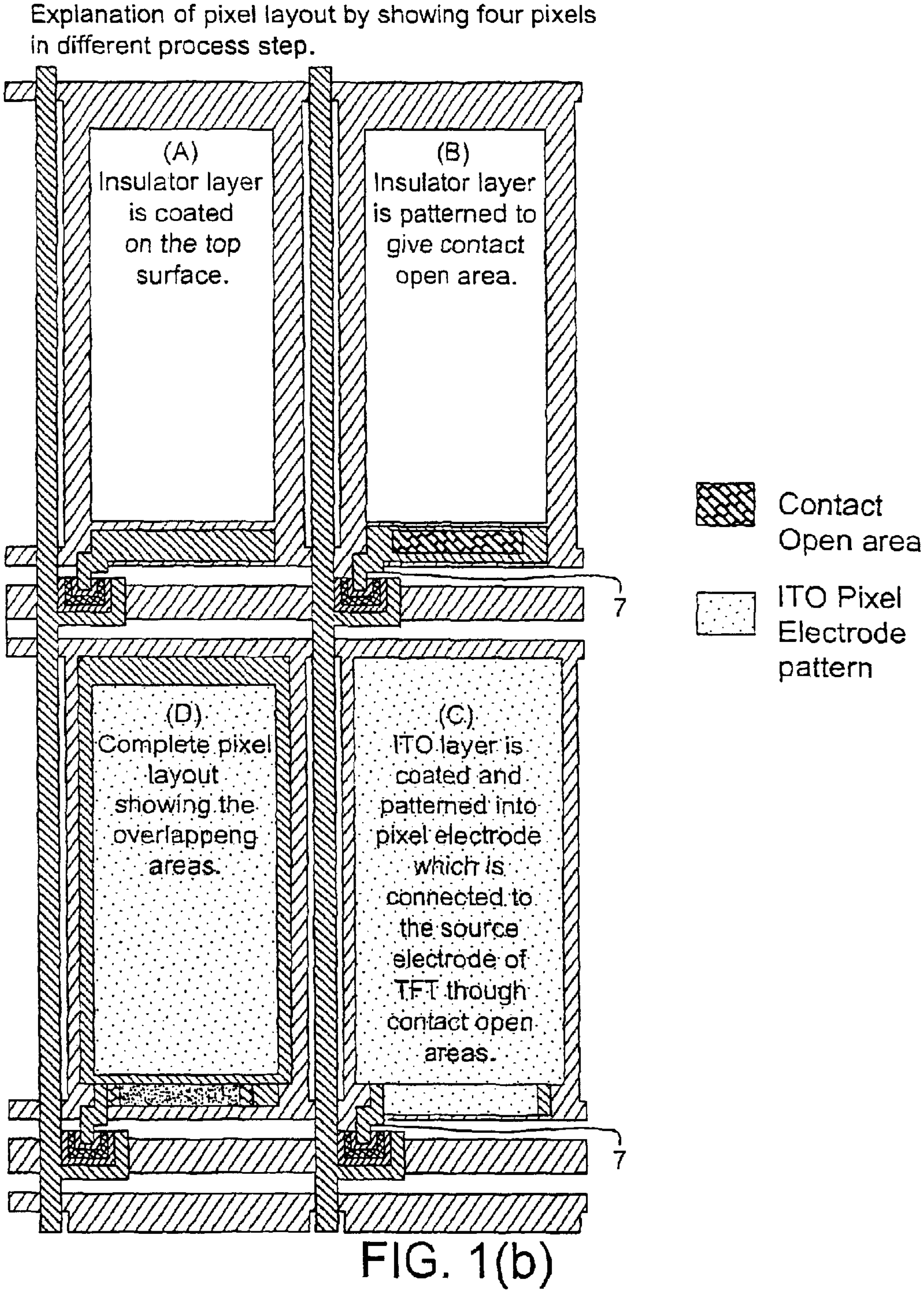

FIG. 1(*a*) is a diagram showing a portion of a exemplary thin-film-transistor array that includes elements for controlling the illumination of four corresponding pixel locations in a flat-panel LCD display screen and two types of the gate to common short defects in TFT array. In order to better understand FIG. 1(*a*), reference may be made to FIG. 1(*b*) which shows the pixel layout in different process steps of the TFT array of FIG. 1(*a*).

The array includes a plurality of gate lines 1 and data lines 2 arranged in the form of a matrix. Each point of intersection between these lines include a storage element 3 connected to a switching transistor 4. The storage element includes a capacitor which stores a voltage value that activates an associated liquid crystal material, which is added in the cell process, when the transistor is switched off. The liquid crystal material is sandwitched between an ITO pixel electrode and another ITO electrode on the opposing glass which is placed against TFT array glass in the cell assembly process. The gate lines control switching of the transistors and the data lines provide image signal data. The array also includes a plurality of common lines 6 situated parallel to the gate lines and connected to the storage capacitor of each pixel along respective rows of the array. The common lines function to provide the reference electric potential for the storage capacitor. Reference numeral 7 corresponds to a metal pattern connecting the source electrode of TFT and ITO pixel electrode via a contact open area illustrated in FIG. 1(*b*).

The array shown in FIG. 1(*a*) has what is commonly referred to as a double common-line layout, since each row of pixels has double-common lines connected to the storage capacitors and each gate line is placed between self- and adjacent-common lines. While the system and method of the present invention are ideally suited to detecting the existence and location of errors in a TFT array of this type, those skilled in the art can appreciate that the invention may just as easily be applied to TFT arrays having other configurations including but not limited to the layouts of single-common line, single-gate line, and double-gate line where each row of pixels has double-gate lines connected to the TFT gate electrodes and each common line is placed between upper and lower self-gate lines.

Figure 2:
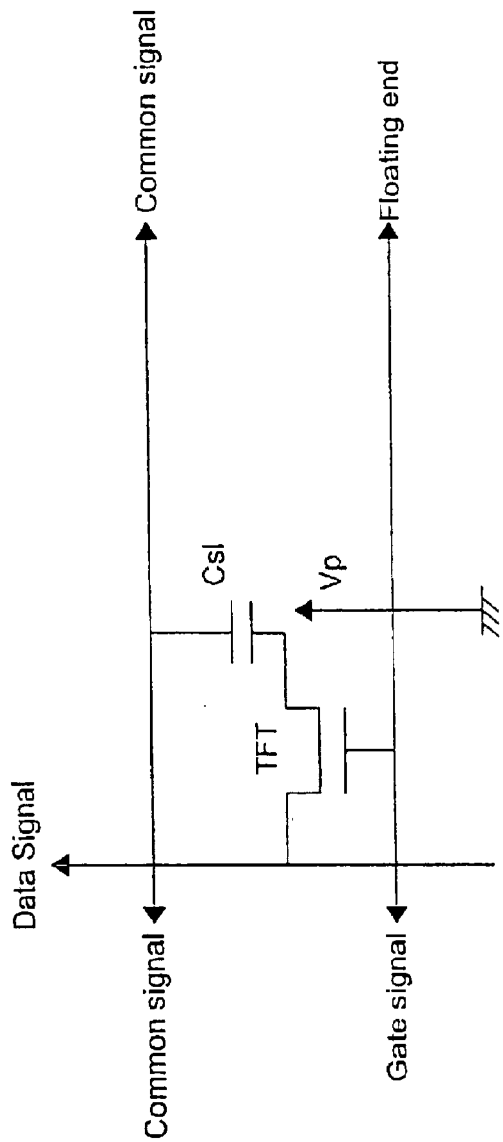
FIG. 2 is a diagram showing an equivalent circuit for the elements at each point of intersection of the thin-film-transistor array of FIG. 1.

FIG. 2 is an equivalent circuit diagram showing elements included at each point of intersection of the array. In this diagram, the storage capacitor is labeled Cst and the transistor TFT. For illustrative purposes, the pixel voltage $V_p$ is shown as corresponding to the storage capacitor voltage. In operation, when a gate signal switches the TFT on, Cst is charged to the image signal voltage present on the data signal line at that time. Liquid crystal material controls the amount of light passing through the ITO electrodes and operation of liquid crystal material is controlled by the voltage applied across the ITO electrodes. After the TFT is turned off, the voltage across the ITO electrodes can be maintained until a next turn-on time with help from Cst for charge holding. Each gate line controls the turning on and off of all the TFTs connected to it and a scanning signal is applied to one gate line at a time sequentially.

As previously explained, during the manufacturing process it is possible for defects to form in the TFT array. One defect that is particularly troublesome is a short between the gate and common lines. At least two types of shorts are possible. One short can form between a common line and gate line of the same pixel element. This type of short is illustratively shown by metal residue 8 in FIG. 1(*a*) and may be referred to as a gate to self-common line short. Another short can form between the gate line of one pixel element and the common line of another pixel element. This type of short is illustratively shown by metal residue 9 in FIG. 1(*a*) and may be referred to as a gate to adjacent-common line short.

Figure 3:
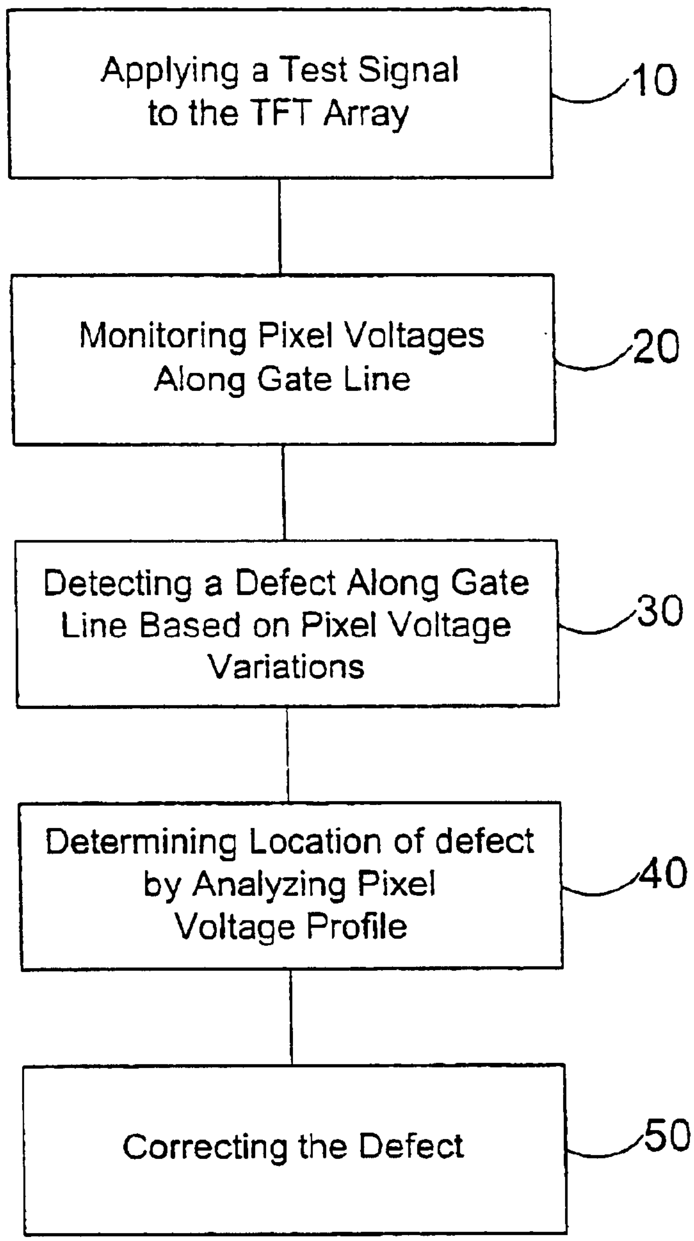
FIG. 3 is a flow diagram showing steps included in a method for detecting the existence of a short between a gate line and common line of a TFT array in accordance with one embodiment of the present invention.

FIG. 3 shows steps included in a method for detecting the existence of a short between a gate line and common line of a TFT array in accordance with one embodiment of the present invention. These steps may be equally applied to both types of shorts mentioned above. The method includes as an initial step applying a test signal to the array. (Block 10). The test signal may be applied to one or more lines of the array. Signal patterns are applied to the gate, data, and common lines in sequence for each row of the array or in multiple rows at the same time. The test voltages in the pattern are set to allow signals indicative of the existence of defect along the gate lines to produce a distinctive pattern which may be identified and measured by a detector.

A second step of the method includes monitoring the pixel voltages along each gate line as the test signals are applied. (Block 20). When no defect exists along the gate lines, the pixel voltages are expected to produce a certain signal profile, depending on the magnitude and frequency of the test signals applied. For example, the pixel voltage profile monitored along the gate lines may have a constant value when no gate-to-common-line short exists. On the other hand, when such a defect exists a different profile may be identified and detected. For example, as will be discussed in greater detail below the profile of the pixel voltages monitored along a gate line under test may follow a predictable variation.

A third step of the method includes detecting a defect associated with the gate line based on the variation in pixel voltage detected during the monitoring step. (Block 30). For example, under certain circumstances and test voltage patterns, the pixel voltage may vary linearly starting from a feeding end of the line. When this occurs, a high degree of probability exists that a defect exists along the gate line under test. As previously mentioned, the gate line and common line may be connected to a same pixel element in which case one profile variation is produced. If the gate and common lines are connected to different pixel elements, a different profile variation may be produced. The specific variation detected provides a basis for determining, for example, not only that a defect exists along the gate line but also what specific type of defect exists, e.g., a gate line to self-common line short or a gate line to adjacent-common line short.

A fourth step of the method includes determining a location of the defect along the gate line under test. (Block 40). The location of the defect may be determined by further analyzing the pixel voltage profile of the affected gate line. For example, in one implementation the pixel voltage profile may continue to vary linearly along the gate line up to a point where the defect exists. At this point, a detectable change in the profile may occur, e.g., the profile may change slope or the rate of variation may change. Alternatively, it may be determined that the profile hit a maximum or minimum value depending, for example, on whether the test signals applied correspond to a positive or negative pixel voltage. Because a close correspondence exists between the profile and points along the gate line being tested, the location of defects may be detected with precision based on detectable profile variations.

A fifth step includes a correcting or otherwise eliminating the defect. (Block 50). If the defect is a short, this step may include cutting the short with any one of a variety of known cutting tools. Other known methods for correcting defects may also be employed.

The method of the present invention may be modified in various ways. For example, in an alternative embodiment the pixel voltage profile may be measured indirectly and some of the signal patterns in FIGS. 4(*a*) and (*b*) are modified accordingly. In some TFT array test equipment used in manufacturing line, the pixel voltage is measured through some medium such as optical modulator or electron beam to detect the defect location. In some other TFT array test equipment used in manufacturing line, the defect location is detected by sensing the amount of charge stored in the storage capacitor after charging operation. In order to apply the present invention to this charge sensing technology, the pixel voltage profile described in the present invention needs to be obtained through the information obtained from the charge sensing operation. One of the methods to obtain the pixel voltage profile through the charge sensing technique is to switch the data line into some reference electric potential at Vp measurement time at FIG. 4 and scan one gate line at a time so that the charge flow to the reference electric potential is measured. The amount of charge flow then reflects the pixel voltage on storage capacitor. Scanning the gate line can be done by raising the Vg and Vcom signals by the same magnitude at the same time in case of FIG. 4(*a*). This way of scanning drives the TFTs and storage capacitors on the gate line in equal condition even if there is a short between the gate and common lines.

Specific examples of the method of the present invention will now be discussed. These examples are provided merely for purposes of illustrating how the invention may be applied in various exemplary contents and therefore are not intended to limit the invention in any way. In discussing these examples, reference may be made to the aforementioned drawings.

As previously discussed, FIG. 1 shows two types of gate-to-common line shorts in a TFT array having a double common-line layout. For both types of shorts, it may be assumed that all the gate lines are connected together by gate shorting bat. The shorting bat connects the metal lines of the same signal together electrically by a low-resistance metal bar-shaped pattern in the perimeter of TFT array area. The shorting bars are currently used for the gate and data lines by many TFT-CLD manufacturers to decrease the number of test probes to the gate and data lines or reduce the damage due to ESD (electro-static discharge) problem. The shorting bars are eventually removed in a later process.

It may also be assumed that all the common lines are connected together because they are normally connected by the TFT panel layout without shorting bar. In one variation, even and odd gate lines may be respectively connected by even and odd gate shorting bars and similar methodology as explained herein may be applied. When the shorting bar is not used, pixel charging and discharging are performed row by row and similar methodology may also be applied. FIG. 2 shows an equivalent circuit for one cross point in the TFT array, where TFT and Cst indicate the thin film transistor and storage capacitor for each pixel respectively.

Figure 4A:
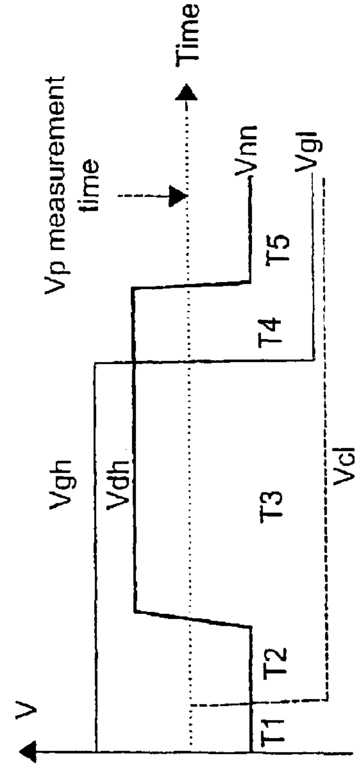
FIGS. 4(*a*) and 4(*b*) are graphs showing exemplary test signal patterns that may be applied to a TFT array for purposes of detecting shorts between gate and common lines in accordance with the present invention.
Figure 4B:
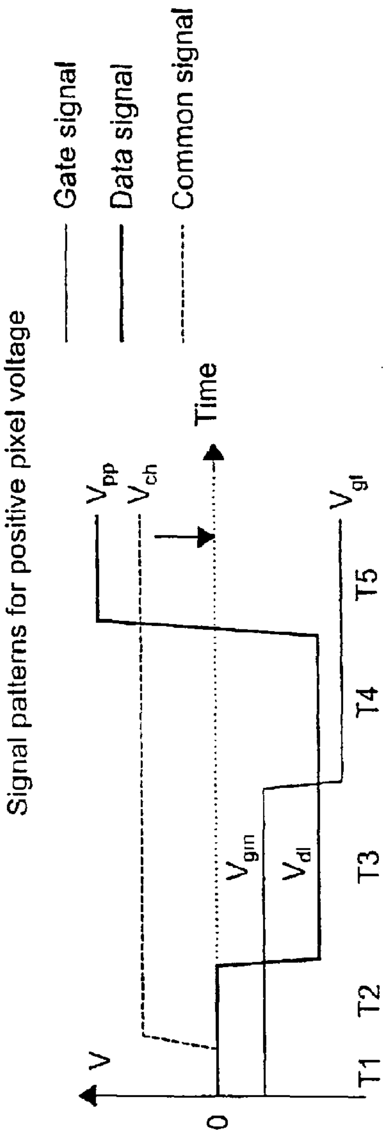

FIGS. 4(*a*) and 4(*b*) show test signal patterns that may be applied to the TFT array for purposes of detecting, short defects between the gate and common lines. More specifically, FIG. 4(*a*) shows a test signal pattern that may be applied for a positive pixel voltage and FIG. 4(*b*) shows a test signal pattern that may be applied for a negative pixel voltage. As the legends show, the thick and thin lines in these graphs represent signal patterns that may be applied to the data and gate shorting bars respectively and the dashed line represents the signal pattern applied to the common signal pad. These shorting bars are intentionally formed in the TFT array for purposes of testing or reducing ESD damage and are preferably laid out along a perimeter of TFT array area. To locate defects, test signals may be provided to multiple signal lines through the shorting bars. (These shorting bars are in contrast to the short defects that the invention is applied to detect and repair. These defects are ones which accidently form within the TFT array area, for example, as a result of an anomaly during manufacturing.)

When no gate-to-common line short exists, the potential voltage is constant along the gate line because one end of the gate line is electrically almost floating. On the other hand, when a gate-to-common short exists the potential voltage along the gate line is not constant but rather varies linearly from the feeding end (e.g., where the gate line is connected to a gate shorting bar) to the short point and then stays constant from the short point to the floating end of the gate line. The slope of linear variation of the gate potential voltage may be determined by simple calculation based on Ohmic Law, where the resistance values such as the resistance per unit length of gate line and the resistance per unit length of the common line are used. In order to locate the short point, it is preferable for the pixel voltage (Vp) to be closely influenced by the potential voltage on the gate line. This may be achieved, in one way, by initially charging Cst to a known voltage and then recharging Cst into the voltage whose value is limited by the gate voltage.

It is further noted that when a gate-to-common line short exists, the potential voltage may also not be constant along the common line. Also, its change of amplitude with time may not be constant along the common line. This variance will affect the value of Vp along the common line, which therefore may provide a further basis for detecting defects in the TFT array. This may be explained in greater detail as follows.

As previously noted, the pixel voltage profile along the gate line is another expression for the pixel voltage profile along the self-common line. And, the pixel voltage profile along the adjacent-common line is another expression for the pixel voltage profile along the adjacent-gate line. The pixel voltage $V_p$ corresponds to the storage capacitor voltage and the common line transmits the reference electric potential for the storage capacitor. The gate line transmits the gate signal to the gate electrodes of all the TFTs connected to the gate line. Thus, the variance of $V_p$ along the common line may provide a further basis for detecting gate-to-common line short defects.

In the examples which follow, the common lines are assumed to be connected to the common signal pattern at both ends, as shown in FIG. 2. Also, in these examples the following voltages will be used as test pattern signals and signals which are monitored to determine the existence and location of a gate-to-common line short in the array:

Vp=pixel voltages measured along a gate line under test

Vgh=high value of gate signal

Vgm=middle value of gate signal

Vgl=low value of gate signal

Vdh=high value of data signal

Vdl=low value of data signal

Vnn=start and end values of data signal for positive Vp

Vpp=end value of data signal for negative Vp

Vcl=low value of common signal

Vch=high value of common signal

Given these voltages, when no defect exists in the TFT array, all the storage capacitors are charged to a predetermined voltage (e.g., Vdh) during a time period T3 in FIG. 4(*a*) as long as Vgh is higher than Vdh by at least Vth, which is a threshold voltage of TFT. If TFTs remain in the off state during time periods T4 and T5 (discussed in greater detail below), the pixel voltages neatly remain at Vdh until the TFT-array tester measures them. In FIG. 4(*b*), when there is no defect in TFT array all the storage capacitors are charged to Vdl during time period T3 as long as Vgm is higher than Vdl by at least a predetermined threshold voltage Vth. If TFTs remain in the off state during time periods T4 and T5, the pixel voltages nearly remain at Vdl until the TFT-array tester measures them. For illustrative purposes, it may be assumed in the following examples that Vgh=25, Vgm=−15, Vgl=−25, Vdh=20, Vdl=−20, Vnn=−20, Vpp=25, Vcl=−25, Vch=20, and the resistance per unit length of gate line=2* the resistance per unit length of common line.

Detection of Gate-to-Self-Common-Line Short

The method of the present invention may be adapted to detect shorts between a common line and a gate line connected to a same pixel element. A short of this type is illustratively shown by reference numeral 8 in FIG. 1(*a*). Examples of test patterns which may be applied to the array to detect this type of short and their corresponding signal profiles are discussed below.

Analysis of Signal Patterns for Positive Pixel Voltages

Figure 5:
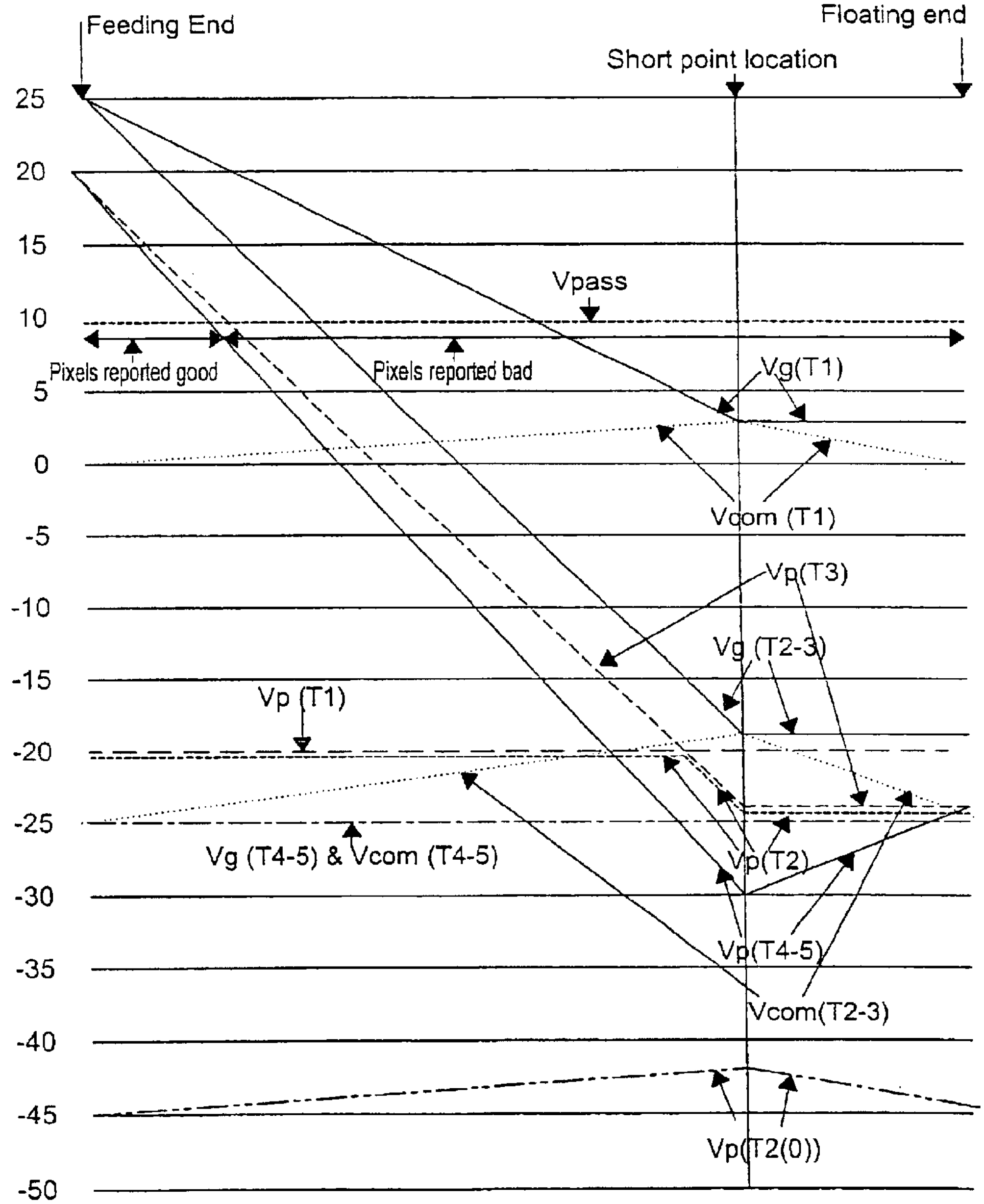
FIG. 5 is a diagram showing a profile of signal voltages (including positive pixel voltages Vp) generated in response to the test signal pattern in FIG. 4(*a*) along a gate line when a gate-to-self-common short is present. This profile may provide a basis for locating defects in a TFT array in accordance with the present invention.

Referring to FIG. 5, analysis of pixel voltages Vp along a gate line under test with a gate-to-self-common short is preferably performed in a step-by-step sequence using the signal patterns for positive pixel voltage set forth in FIG. 4(*a*). At time T1, the potential voltages along the gate line and self-common line are shown by Vg(T1) and Vcom(T1) respectively. The pixel voltage Vp is charged to Vnn as denoted by Vp(T1).

At the beginning of time period T2, the self-common signal drops from 0 to Vcl and Vcom drops from Vcom(T1) to Vcom(T2–3). This causes Vp to drop from Vp(t1) to Vp(T2(0)) but Vp charges to Vp(T2) during the T2 period because the TFT is turned on as long as Vp is lower than a predetermined amount (Vg−Vth). When Vp charges to (Vg−Vth), the TFT is turned off and Vp becomes saturated at (Vg−Vth). Since the data signal is now Vnn, the highest level of Vp(T2) is limited to Vnn.

At the beginning of time period T3, the data signal becomes Vdh and Vp(T3) becomes limited by (Vg (T3)−Vth) or Vdh whichever is lower. If Vdh is lower than (Vg (T3)−Vth) toward the feeding end, then Vp (T3) becomes saturated by Vdh and a slope change occurs toward the feeding end.

At the beginning of time period T4, the gate signal drops from Vgh to Vgl and Vcom drops from Vcom(T2–3) to Vcom (T4–5). This causes Vp to drop from Vp(T3) to Vp(T4–5). Vg (T4–5) makes Vp stay at Vp (T4–5). If 10 volts is used as the Vp criteria (Vpass) above which the pixels are reported as good ones, then there will be multiple pixels reported as bad ones along the gate line with a short defect as shown in FIG. 5.

Using conventional techniques, this defect will at best be reported as a line defect even though the source of the line defect is a short defect between the gate and common lines at a specific location. Typically, the line defect is reported with the gate and data line numbers of two end points, but the location of actual short defect is not given. As can be seen from Vp(T4–5) in FIG. 5, the method of the present invention generates a final pixel voltage profile along the gate line with a short defect, which can be relied on for pinpointing with accuracy the location of the short defect by finding the lowest pixel voltage or the cross point of two lines of Vp having different slope.

Analysis of Signal Patterns for Negative Pixel Voltages

Figure 6:
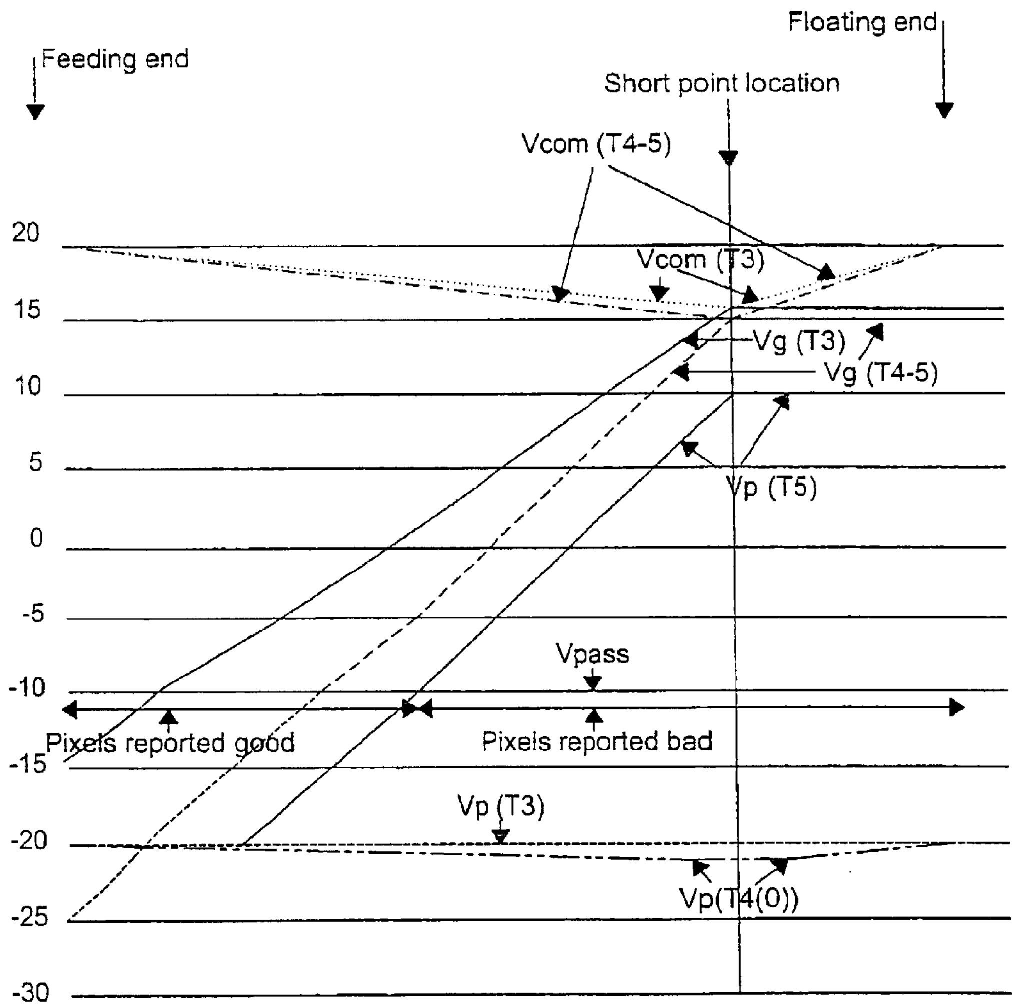
FIG. 6 is a diagram showing a profile of signal voltages (including negative pixel voltages Vp) generated in response to the test signal pattern in FIG. 4(*b*) along a gate line when a gate-to-self-common short is present. This profile may provide another basis for locating defects in a TFT array in accordance with the present invention.

Referring to FIG. 6, analysis of pixel voltages Vp along the gate line with a gate to self-common short is performed in a step-by-step sequence using the signal patterns for negative pixel voltage in FIG. 4(*b*). In this example, the values at times T1 and T2 may be considered negligible or at least not substantially affecting the end result of the analysis. Accordingly, the discussion will begin at time T3.

During time period T3, the potential voltages along the gate lien and self-common line are shown by Vg(T3) and Vcom(T3) respectively. The Vp is charged to Vdl as denoted by Vp(T3). It is also noted that during time period T3, the short defect between the gate and self-common lines makes the gate signal more positive compared to the case where no such defect exists. This is because the gate line at Vgm is shorted to the self-common line at Vch, which is higher than Vgm. A higher gate signal makes the TFTs on the gate line turn on with lower on-resistance and the storage capacitors on the gate line charge to Vdl more quickly than those on other gate lines without short defect.

At the beginning time period T4, the common signal drops from Vgm to Vgl and Vcom drops from Vcom(T3) to Vcom(T4–5). This causes Vp to drop from Vp(T3) to Vp(T4(0)). Also during this time period, Vp begins to approach Vp(T3) once agains since the data signal is at Vdl and Vg has a potential profile of Vg (T4–5).

At the beginning time period T5, the data signal becomes Vpp and Vp charges to Vp(T5) because Vp becomes saturated at (Vg (T5)−Vth) before reaching Vpp. If −10 volts is used as the Vp criteria (Vpass) below which the pixels are reported as good ones, then there will be multiple pixels reported as bad ones along the gate line with a short as shown in FIG. 6.

Using conventional methods, this defect would at best be reported as a line defect even though the source of the line defect is a short defect between the gate and common lines at a specific location. However, as can be seen from Vp(T5) in FIG. 6, the method of the present invention generates a final pixel voltage profile along the gate line with a short, which can be relied on to locate the short defect by finding the end of low-constant pixel voltage where Vp starts to decrease toward the feeding end.

Analysis of Pixel Patterns for both Positive and Negative Pixel Voltages

Figure 7:
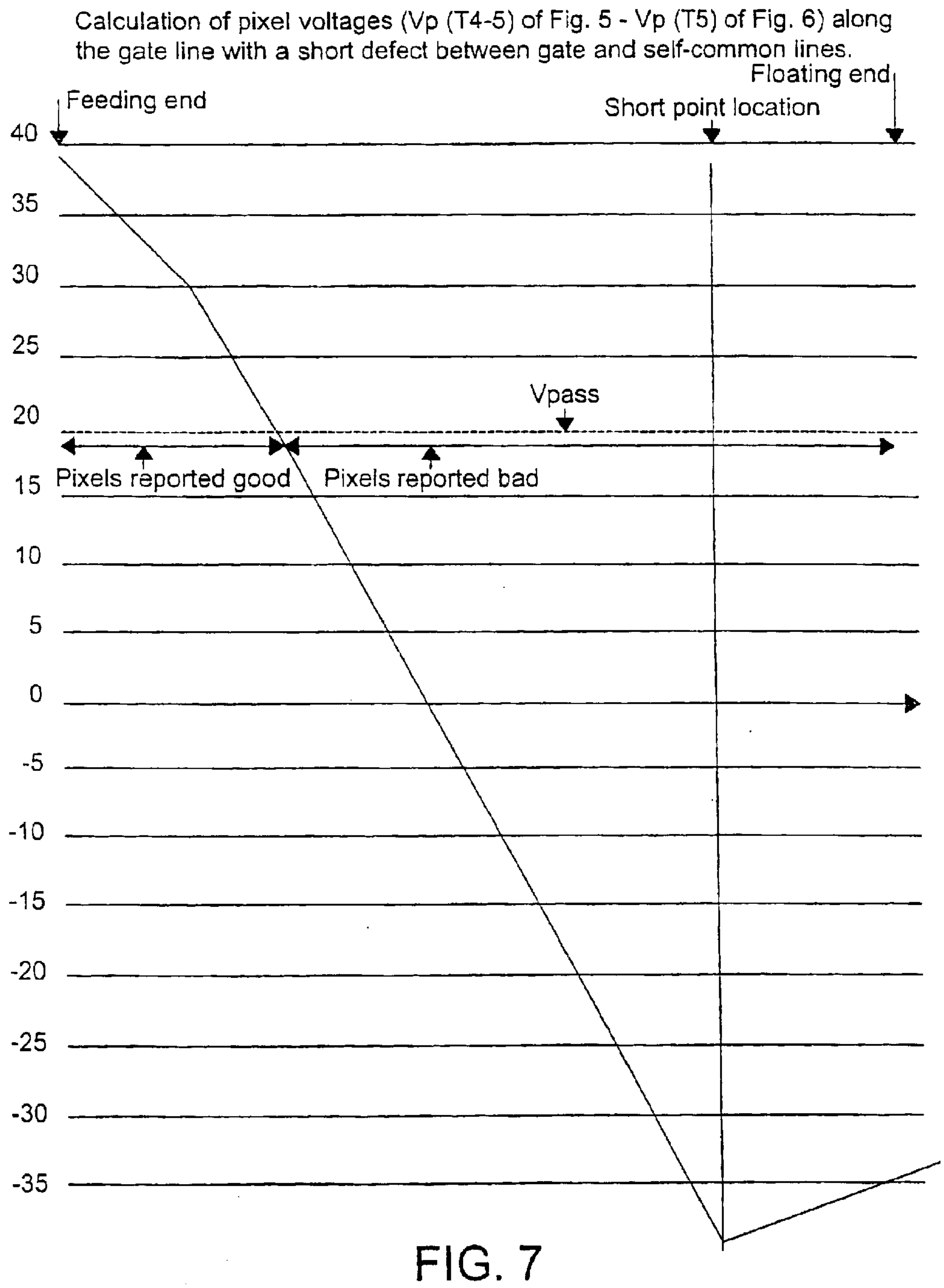
FIG. 7 is a diagram showing a profile of signal voltages generated from the positive and negative pixel voltages in FIGS. 5 and 6. This profile may be used as another basis for detecting defects in a TFT array in accordance with the present invention.

If Vp (T4–5) of FIG. 5 obtained from the test pattern of FIG. 4(*a*) is subtracted by Vp(T5) of FIG. 6 obtained from the test pattern of FIG. 4(*b*), this result may be used to generate a final pixel voltage profile along the gate line with a short defect, as shown in FIG. 7. If 20 volts is used as the Vp criteria (Vpass) above which the pixels are reported as good ones, then there will be multiple pixels reported as bad ones along the gate line with a short as shown in FIG. 7. Using conventional methods, this defect at best is reported as a line defect even though the source of the line defect is a short between the gate and common lines at certain location. As in FIG. 5, using the present invention the short defect can be located with pinpoint accuracy by finding the lowest pixel voltage or the cross point of two lines of Vp having different slope.

Detection of Gate-to-Adjacent-Common-Line Short

The method of the present invention may be adapted to detect shorts between a common line and a gate line connected to different pixel elements. A short of this type is illustratively shown by reference numeral 9 in FIG. 1(*a*). Examples of test patterns which may be applied to the array to detect this type of short and their corresponding signal profiles are discussed below.

Analysis of Signal Patterns for Positive Pixel Voltages

Figure 8:
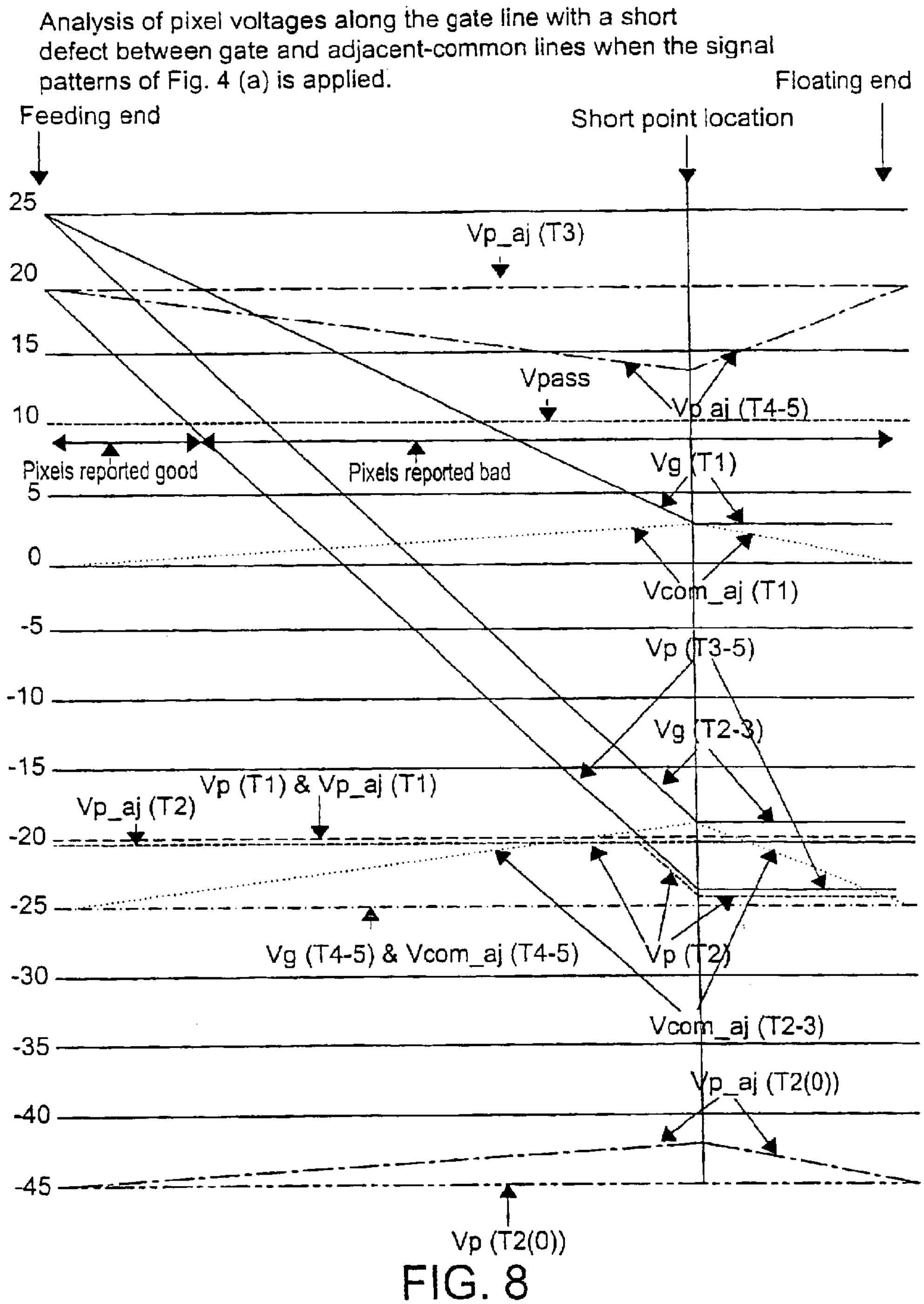
FIG. 8 is a diagram showing a profile of signal voltages (including positive pixel voltages Vp) generated in response to the test signal pattern in FIG. 4(*a*) along a gate line when a gate-to-adjacent-common short is present. This profile may provide a basis for locating defects in a TFT array in accordance with the present invention.

Referring to FIG. 8, analysis for pixel voltages Vp along the gate line with a short to adjacent-common line and for pixel voltages Vp_aj along the adjacent-common line with a short to adjacent gate line is performed in a step-by-step sequence using the signal patterns for positive pixel voltage in FIG. 4(*a*).

At time T1, the potential voltages along the gate line and adjacent-common line are shown by Vg(T1) and Vcom_aj (T1) respectively. The pixel voltage Vp of gate line is charged to Vnn as denoted by Vp(T1). The pixel voltage Vp of the adjacent-common line is charged to Vnn as denoted by Vp_aj (T1).

At the beginning time period T2, the common signal drops from 0 to Vgl and Vcom of adjacent-common line drops from Vcom_aj(T1) to Vcom_aj(T2–3). This causes Vp_aj to drop from Vp_aj(T1) to Vp_aj(T2(0)). The Vcom of gate line with a short drops from 0 to Vgl and this causes Vp to drop from Vp(T1) to Vp(T2(0)). Also, during the time period T2, Vp charges to Vp(T2) because the TFT is turned on as long as Vp is lower than a predetermined voltage (Vg−Vth), where Vth is a threshold voltage of TFT. When Vp charges to (Vg−Vth), the TFT is turned off and Vp becomes saturated at (Vg−Vth). Since the data signal is now Vnn, the highest level of Vp(T2) is limited to Vnn. The gate signal for TFTs on the adjacent-common line is now at Vgh and Vp_aj (T2) reaches Vnn.

At the beginning time period T3, the data signal becomes Vdh and Vp(T3) becomes limited by (Vg (T3)−Vth) or Vdh, whichever is lower. If Vdh is lower than (Vg (T3)−Vth) toward the feeding end, then Vp(T3) becomes saturated by Vdh and experiences a slope change toward the feeding end. The gate signal for TFTs on the adjacent-common line, however, is still at Vgh and Vp_aj (T3) reaches Vdh.

At the beginning time period T4, the gate signal drops from Vgh to Vgl and Vcom_aj drops from Vcom_aj (T2–3) to Vcom_aj (T4–5). This causes Vp_aj to drop from Vp_aj (T3) to Vp_aj (T4–5). During time periods T4 and T5, Vp_aj stays at Vp_aj (T4–5) since the gate signal for TFTs on the adjacent-common line with the short defect is at Vgl. Vg (T4–5) makes Vp stay at Vp (T3–5) since the gate signal is low enough to turn off all the TFTs on gate line with short defect. If 10 volts is used as the Vp criteria (Vpass) above which the pixels are reported as good ones, then there will be multiple pixels reported as bad ones along the gate line with a short defect as shown in FIG. 8.

Using conventional methods, this defect at best is reported as a line defect even though the source of the line defect is a short between the gate and common lines at a specific location. Typically, the line defect is reported with the gate and data line numbers of two end points, but the location of the actual short defect is not given. As can be seen from Vp (T3–5) in FIG. 8, the present invention generates a final pixel voltage profile along the gate line with a short, from which the short defect can be located by finding the end of the low-constant pixel voltage where Vp starts to increase toward the feeding end.

Analysis of Signal Patterns for Negative Pixel Voltages

Figure 9:
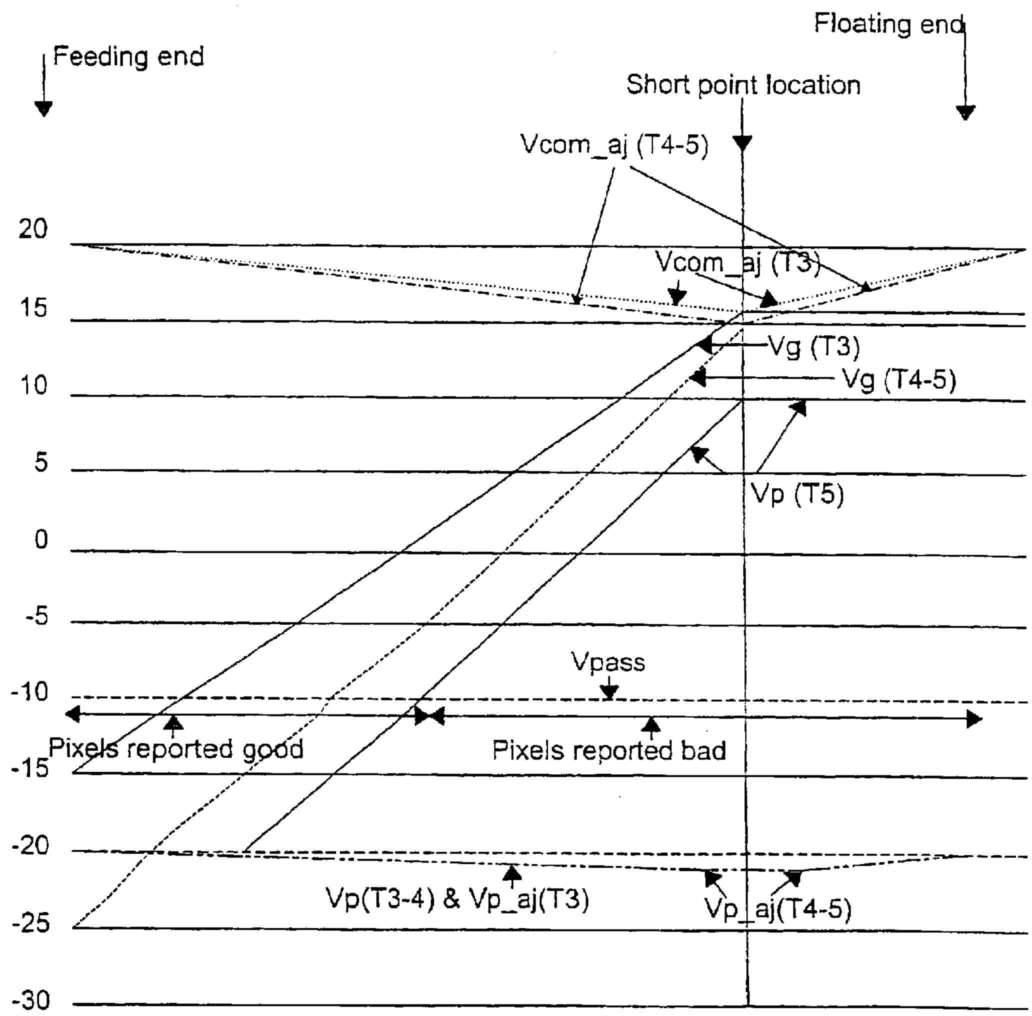
FIG. 9 is a diagram showing a profile of signal voltages (including negative pixel voltages Vp) generated in response to the test signal pattern in FIG. 4(*b*) along a gate line when a gate-to-adjacent-common short is present. This profile may provide another basis for locating defects in a TFT array in accordance with the present invention.

Referring to FIG. 9, analysis for pixel voltage, Vp, along the gate line with a short defect to adjacent-common line and for pixel voltage, Vp_aj, along the adjacent-common line with a short defect to adjacent gate line is done in step by step sequence using the signal patterns for negative pixel voltage in FIG. 2(*b*). In this example, the values at times T1 and T2 may be considered negligible or at least not substantially affecting the end result of the analysis. Accordingly, the discussion will begin at time T3.

At time T3, the potential voltages along the gate line and adjacent-common line are shown by Vg (T3) and Vcom_aj (T3) respectively. The Vp and Vp_aj are charged to Vdl as denoted by Vp (T3) and Vp_aj (T3) respectively. It is also noted that during time period T3, the short defect between the gate and adjacent-common lines makes the gate signal more positive compared to the case where no such defect exists because the gate line at Vgm is shorted to the adjacent-common line at Vth, which is higher than Vgm. A higher gate signal makes the TFTs on the gate line turn on with lower on-resistance and the storage capacitors on the gate line charge to Vdl more quickly than those on other gate lines without short defect. The TFTs on the adjacent-common line with the short defect receives normal gate signal and the storage capacitors on the same line charge to Vdl.

At the beginning time period T4, the common signal drops from Vgm to Vgl and the Vcom_aj drops from Vcom_aj (T3) to Vcom_aj (T4–5). This causes Vp_aj to drop from Vp_aj (T3) to Vp_aj (T4–5). During time period T4, Vp_aj stays at Vp_aj (T4–5) since the gate signal at Vgl turns off the TFTs on the adjacent-common line and Vp stays at Vp (T3–4) since the data signal is at Vdl.

At the beginning time period T5, the data signal becomes Vpp and Vp charges to Vp (T5) because Vp becomes saturated at (Vg (T5)−Vth) before reaching Vpp. If −10 volts is used as the Vp criteria (Vpass) below which the pixels are reported as good ones, then there will be multiple pixels reported as bad ones along the gate line with a short defect as shown in FIG. 9.

Using conventional methods, this defect at best is reported as a line defect even though the source of the line defect is a short between the gate and common lines at a specific location. However, as can be seen from Vp (T5) in FIG. 9, the present invention generates a final pixel voltage profile that can be used to precisely locate the short, by finding the end of low-constant pixel voltage where Vp starts to decrease toward the feeding end.

Analysis of Signal Patterns for Both Positive and Negative Pixel Voltages

Figure 10:
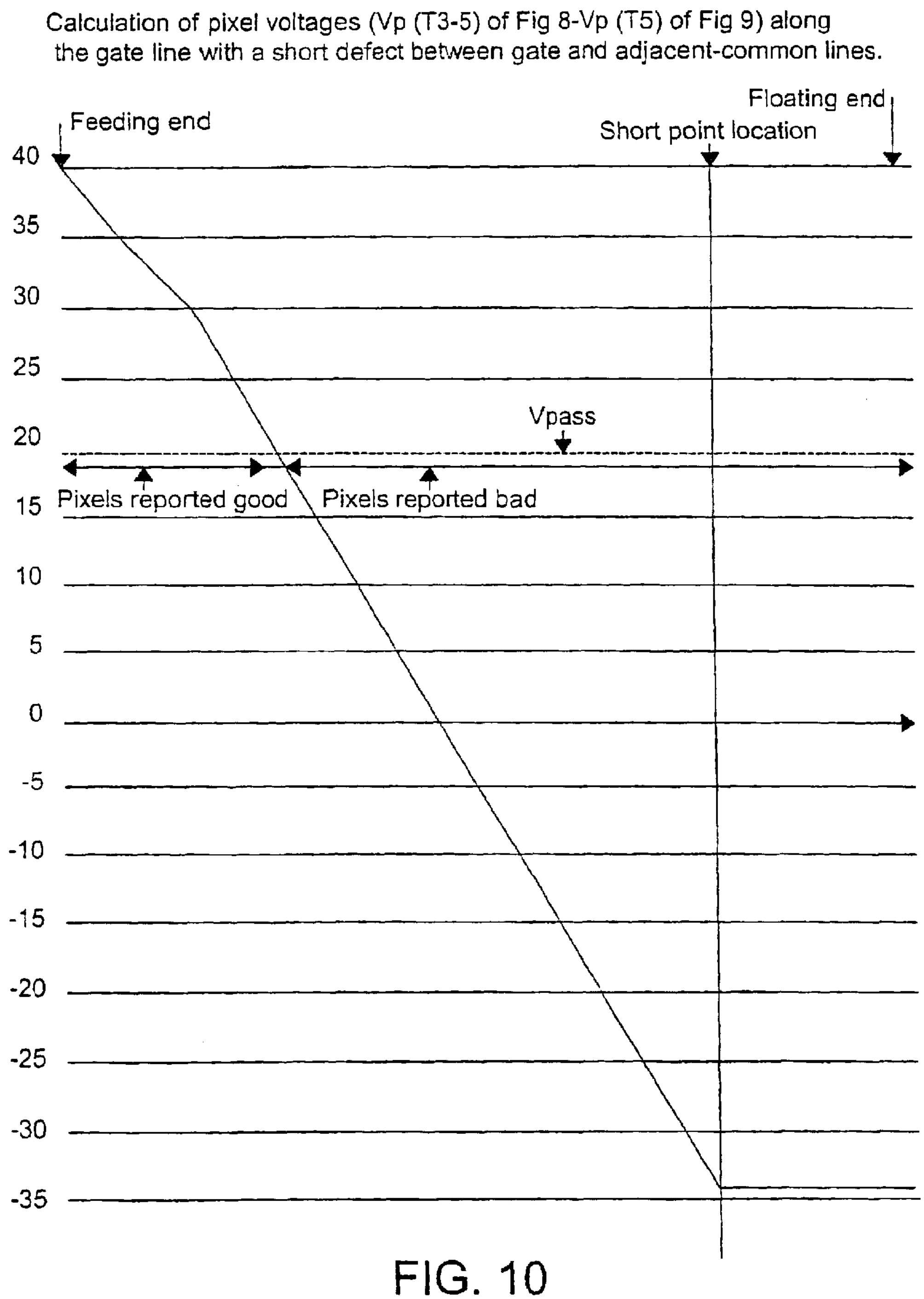
FIG. 10 is a diagram showing a profile of signal voltages generated from the positive and negative pixel voltages in FIGS. 8 and 9. This profile may be used as another basis for detecting defects in a TFT array in accordance with the present invention.

If Vp(T3–5) of FIG. 8 obtained from the test pattern of FIG. 4(*a*) is subtracted by Vp(T5) of FIG. 9 obtained from the test pattern of FIG. 4(*b*), this result may be used to generate a final pixel voltage profile along the gate line with a short defect, as shown in FIG. 10. If 20 volts is used as the Vp criteria (Vpass) above which the pixels are reported as good ones, then there will be multiple pixels reported as bad ones along the gate line with a short defect.

Using conventional methods, this defect at best is reported as a line defect even though the source of the line defect is a short between the gate and common lines at a specific location. As in FIG. 8, the short can be located defect by finding the end of the low-constant pixel voltage where Vp starts to increase toward the feeding end. Also, as can be seen from Vp_aj (T4–5) in FIGS. 8 and 9, the Vp_aj profile along the shorted adjacent-common line does not provide clearly distinctive feature to locate the gate to adjacent-common short defect, although it can generate some partial line defects depending on the value of Vpass.

Other test methodologies may be combined with the method of the present invention to improve the detection accuracy of defects in a TFT array. In this regard, it is noted that it may be considered ideal for one test methodology to detect all types of defects with very high accuracy. As previously described indicated, the present invention can detect the presence and location of gate-to-common-line short defects. For other types of defects, the present invention can detect their location with varying accuracy depending on the type, location, and/or severity of the defects. Thus, it is possible to develop new test methodology to improve the defect detection accuracy for some of the defects. It is also possible to combine the present invention with new methodologies to make use of both methods as long as they can work together, preferably without canceling each other's benefits. For example, in the case of short defects between signal lines, the presence and type of these defects can be identified by performing a preliminary test to check for leakage current between them. A more specific test method may then be used, if necessary, based on the result of the preliminary leakage test.

Figure 11:
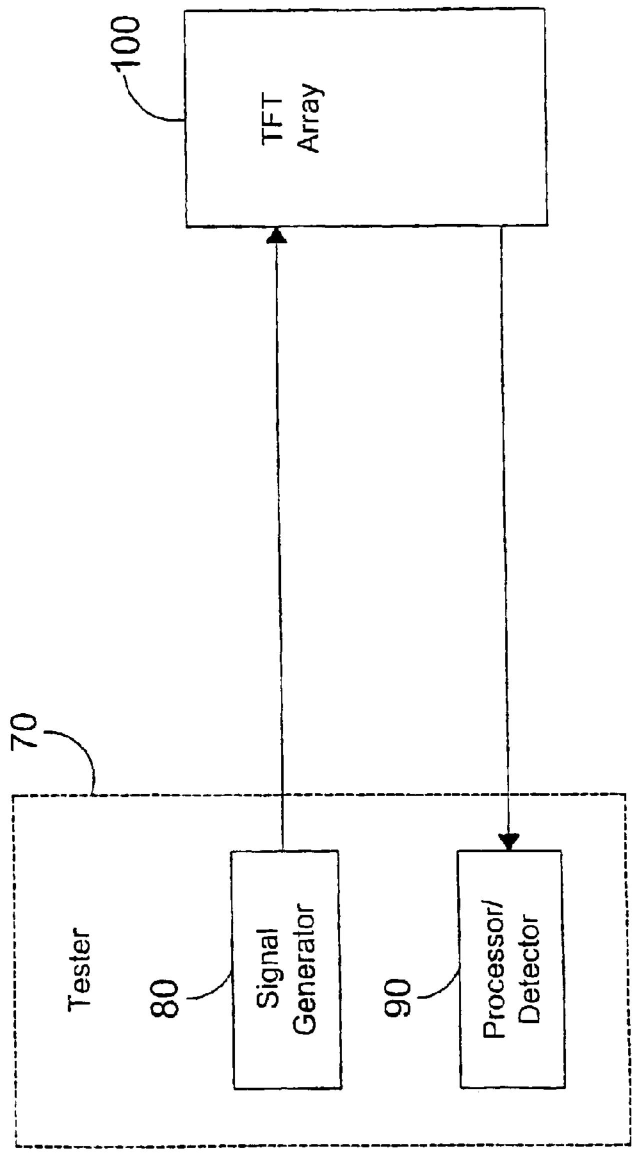
FIG. 11 shows a tester for detecting defects in a TFT array in accordance with one embodiment of the present invention.

FIG. 11 shows a tester 70 for detecting defects in a TFT array 100 in accordance with one embodiment of the present invention. The tester includes a signal generator 80 and a processor/detector 90. The signal generator generates for input a test signal into the TFT array. This test signal may correspond to any one or more of the test signal patterns shown in FIGS. 4(*a*) and 4(*b*). The processor/detector monitors voltages produced in the TFT array as a result of the test signals and generates one or more of the previously mentioned pixel voltage profiles for purposes of detecting the presence and location of gate-to-common line shorts and/or other defects in the TFT array. The tester may also perform any of the other steps of the methods of the present invention described herein.

Manufacturing Process Problem Identification

The present invention also relates to various embodiments of a system and method which classify a defect in an electrical circuit and then identify at least one reason why the defect occurred. The cause is preferably one relating to an anomaly in a manufacturing process used to fabricate the circuit. Once this anomaly (or process problem) is identified, corrective action may be taken to reduce the likelihood of the defect occurring again in subsequently made circuits. The system and method are ideally suited to the analysis of circuits including but not limited to TFT-arrays for LCD displays, printed circuit boards (PCBs), printed board assemblies (PBAs), integrated circuits (IC), or any of the other types of circuits described herein. Moreover, the type(s) of defects to be classified include any of those previously described as well as ones described below, and the same is true of the manufacturing process problems which heretofore have been discussed and ones will be explained in the discussion which follows.

The Inventor has recognized that when a defect is detected and/or located during a manufacturing process of an electrical circuit, access to statistical information showing a distribution of one or more process problems that likely caused the defect would be highly desirable. The present invention provides access to this information based on process problem data collected over time. Using this data, process problems can be monitored in different units of time (e.g., weekly or monthly) and corrective action may be taken to improve the accuracy and efficiency of the manufacturing process.

In accordance with at least one embodiment, the system and method of the present invention uses the collected data as a statistical benchmark to classify defects detected in the circuit and identify the problems that occurred during the manufacturing process that caused, or likely caused, those defects. The collected data is preferably updated to improve problem and defect detection. This may involve modifying one or more process steps and/or parameters to reduce the likelihood of the defect occurring in subsequently made circuits.

Figure 12:
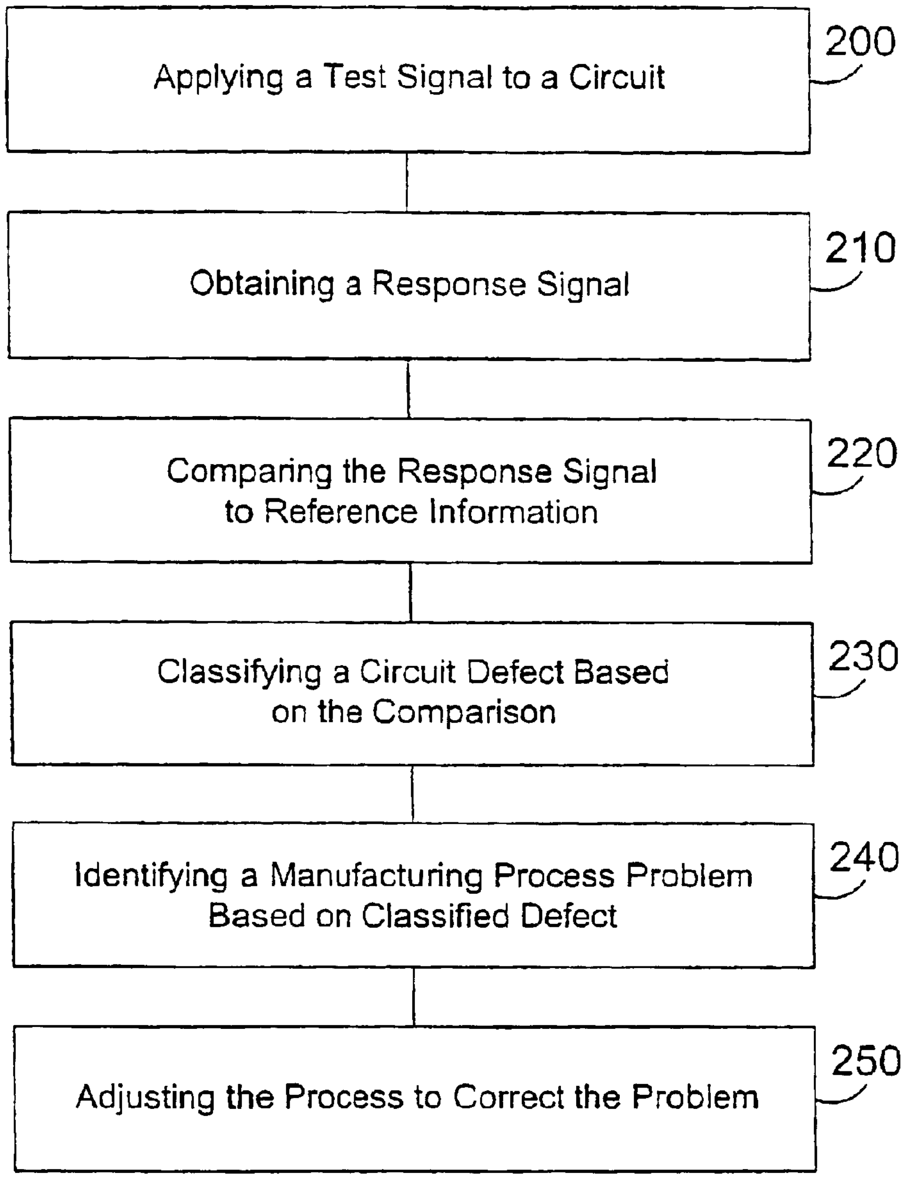
FIG. 12 is a flow diagram showing steps included in one embodiment of a method for classifying defects and identifying corresponding process problems during a product defect analysis.

FIG. 12 is a flow diagram showing steps included in a method for performing circuit defect analysis in accordance with one embodiment of the present invention. An initial step of the method includes applying a test signal to a circuit at some point during the manufacturing process. (Block 200). This may include some intermediate point or after the circuit has been completely formed, or both. The test signal may correspond to any of the test signals previously discussed herein, such as the ones depicted in FIGS. 4(*a*) or 4(*b*).

A second step includes obtaining a signal generated in response to the test signal. (Block 210). This signal may be obtained, for example, using a signal probe or any other type of test equipment detector. The test location for obtaining the signal may be selected to acquire an accurate representation of the portion of the circuit under test, taking into consideration, for example, noise and other external influences that may degrade the quality of the signal.

A third step includes comparing the signal output from the circuit in response to the test signal to reference information. (Block 220). The reference information may take any one of a variety of forms. For example, the reference information may include a signal profile (e.g., a signal curve) corresponding to a predefined type of defect that possibly may occur during the manufacturing process. Preferably, a plurality of signal profiles corresponding to different types of predefined defects are included. The signal profiles may be generated from previous tests of circuits that were detected as having the predefined defects. Preferably, the test data is processed to provide a more accurate statistical basis from which defect detection may be realized. Alternatively, the signal profiles may be generated based on a statistical representation of normal (e.g., non-defective) signal data, an example of which corresponds to a mean of signal values obtained for a non-defective circuit. Signal profiles and/or reference information of other types may be used if desired for purposes of performing defect detection.

Figure 13:
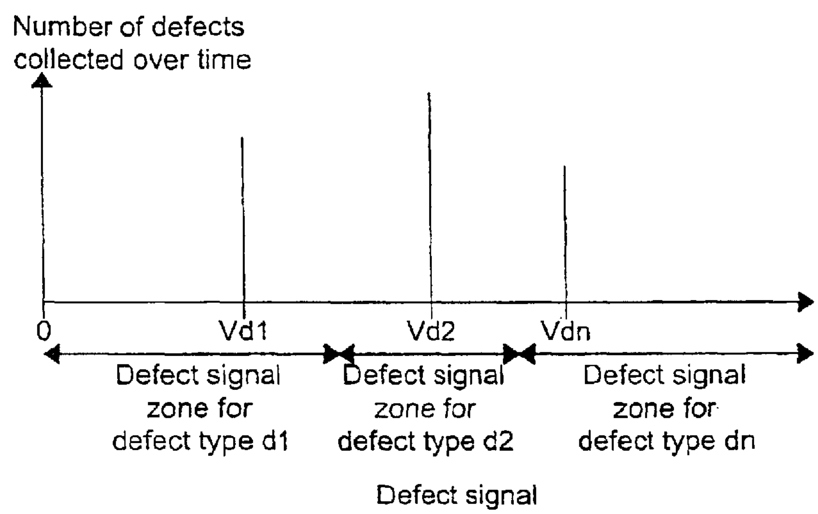
FIG. 13 shows one type of defect histogram that may be used in accordance with the present invention, wherein the histogram was obtained using an ideal distribution of defect signals for defects d1, d2, and dn and where Vd1, Vd2, and Vdn are representative defect signals in respective signal zones for d1, d2, and dn.

FIG. 13 is a graph showing a defect histogram that was obtained using the reference information in accordance with the present invention. The histogram includes three ideal defect signals Vd1, Vd2, and Vdn, each corresponding to a different type of predefined circuit defect. In ideal conditions, each defect has its own unique defect signal, e.g., a distinctively discrete signal defect signal value when it is tested and a defect such as d1 is supposed to give the same defect signal of Vd1 at every test. Then, every defect detected can be identified to certain predefined defect type, such as listed above, by matching the defect signal to one of the unique defect signals of the predefined defect types. In the histogram, the occurring frequency of defects belonging to the specific defect type increases by one for each matching.

In actual measurements of the circuit under test (e.g., a TFT-array) for defect detection, the defect signal may have some noise due to non-ideal factors such as the noise of the measurement equipment. This noise may cause the defect signal to deviate from its ideal value corresponding to the predefined defect type. Thus, it is preferably to go through a process to determine which predefined defect type the detected defect belongs to. One way is to find one of the predefined defects that has the closest defect signal to that of the detected defect. If the detected defect has a defect signal just falling half way between two representative defect signals of two predefined defect types, then each of those two predefined defect types has an increment of one half in their frequency count. In other words, each defect type has its own defect signal zone a predetermined amount (e.g., half way) up to its neighboring representative defect signal, as shown in the FIG. 13. Preferably, these zones are situated so that the zones do not overlap. In the histogram graph, the signal profiles show, for example, that defect signal Vd2 occurred more times during the period of time the data was collected than either of the other two defect signals Vd1 and Vdn.

Figure 14:
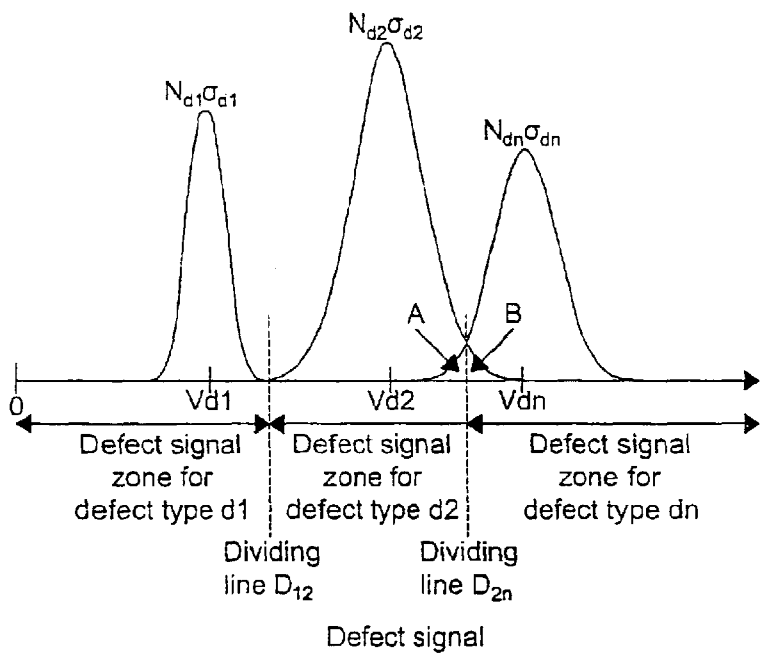
FIG. 14 shows another type of defect histogram obtaining under actual measurement conditions for defects d1, d2, and dn where Vd1, Vd2, and Vdn correspond to defect signals in respective signal zones for d1, d2, and dn.

FIG. 14 is a graph showing a distribution of defect signal profiles that occur under more realistic conditions where, in addition to measurement noise, other degrading influences such as the spreading of the defect signal itself are taken into consideration. Even if there is no measurement noise, many defects show spread distribution of a defect signal because of the varying degree of severity of the defect and the different amounts of signal delay depending on the defect location. While the graph in either of FIGS. 13 and 14 may be used in practicing the present invention, the signal profiles shown in FIG. 14 may be preferably because a more accurate result is likely to be obtained.

In the graph of FIG. 14, each signal profile is illustratively shown as corresponding to a statistical curve developed based on test data taken over a predetermined period of time or on estimated data based on statistical calculation. Each curve has an associated standard deviation σ, mean value V, and probability value N which defines the range within which voltage values corresponding to a respective one of the predefined circuit defects have appeared and thus are likely to appear again in future tests. As in the first graph, each profile curve is set within a separate defect signal zone. However, as reflected by signal profiles for defect types d2 and dn, it is possible for the signal profiles to overlap because of noise and/or other influences.

The reference information used in accordance with the present invention may be stored in a memory, database, or other storage system or medium included within or coupled to the processing system performing the defect analysis. This information is preferably stored in statistical form and may be subsequently modified based on the results obtained for each test to produce a more accurate model for defect signal classification and manufacturing process problem detection, to be described in greater detail below.

A fourth step includes classifying a defect in the circuit based on the comparison performed between the response signal generated by the input test signal and the reference information. (Block 230). This step may be performed by determining whether the response signal falls within any of the signal zones included in the stored profile signal distribution. For example, a response signal falling within the signal zone, or profile curve, corresponding to Vd1 may be classified as corresponding to the predefined defect corresponding to that zone.

A different approach to classification may be taken when the signal profiles in adjacent zones overlap, or more specifically when it is determined that the response signal falls within the signal profiles of two predefined types of defects. This apparent conflict may be resolved in a number of ways. One way involves computing probability values indicating the likelihood that the circuit defect is one of the predefined defects corresponding to the signal profiles. The defect is then classified as the predefined defect having the higher probability. A number of techniques for computing these probability values may be taken.

One technique involves taking mathematical approaches to conflict resolution. One approach is based on Equation 4 and another approach is based on Equations 5–10. These equations are discussed in greater detail below.

Another technique involves taking a logical approach to conflict resolution. According to this approach, a rule-based system stores data and other forms of information indicating combinations of defects that are likely to occur together. The rules of this system, for example, may indicate that a first type of predefined defect usually does not occur unless a second predefined type of defect also exists. These rules may form the basis for resolving the conflicting case of when the response signal falls within the signal profiles of adjacent signal zones. For example, when such a conflict arises between Vd1 and Vdn in FIG. 14, the rule-based system may determine whether a response signal obtained in the same or a separate test corresponds to another predefined defect, which usually occurs with the defect corresponding to Vd1. If another predefined defect does not exist, it may be concluded that Vd1 has a lower probability of corresponding to the circuit defect than Vdn. The circuit defect may therefore be classified as the Vdn defect. Conversely, if the other defect does exist, then Vd1 may be considered to have a higher probability than Vdn and the defect may be classified accordingly.

Another technique is a variation of the previous method, where the probabilities of the conflicting profiles are assigned based on the absence or detection of one or more manufacturing process problems known to be associated with the defect corresponding to the response signal. In this case, the same or separate tests may be performed to determining whether the one or more manufacturing process problems exist.

Another technique involves redefining the signal zones for the overlapping signal profiles. This may be accomplished by adjusting the position of the dividing line between the two zones based on the intersection of the two signal profile curves. This is illustratively shown in FIG. 14, where the dividing line $D_{2n}$ separating defect zone d2 and defect zone dn is adjusted based on the intersection of the two corresponding profiles.

Another techniques involves redefining the signal zones for the overlapping signal profiles based on a desired error distribution. This may be accomplished, for example, by adjusting the position of the dividing line between the two zones to ensure that the error distribution between the profiles is at least substantially equal. Coincidentally, this equal error distribution is shown in FIG. 14, where the position of dividing line $D_{2n}$ is adjusted so that regions A and B have equal areas.

A fifth step includes identifying at least one manufacturing process problem that caused, or likely caused, the classified defect. (Block 240). This may be accomplished by accessing information that links a list of predefined defect classifications with a plurality of manufacturing process problems. This information may, for example, be stored in a memory, a database system, or a rules- or knowledge-based system. The information is preferably derived from test data compiled over a predetermined period of time, which data indicates that certain predefined defects were caused by one or more specific manufacturing process problems. If desired, the data may also provide an indication of what stage during the manufacturing process the defect may have occurred. An example of information compiled from test data of this type is set forth in Table 1 provided below. The fifth step may therefore be implemented by finding the classified defect in the stored list of predefined defect classifications and then acknowledging one or more of the process problems linked to that defect.

An optional sixth step includes adjusting the process to prevent the problem from occurring during the manufacture of subsequent circuits. (Block 250). For example, if the process problem identified in the fifth step was the existence of a foreign particle on an IC substrate before gate insulator film deposition, an adjustment may be made in the form of cleaning the substrate before performing a subsequent gate insulator film deposition process or increasing the frequency of cleaning the inside surface of the gate insulator film deposition vacuum chamber.

One possible application of the method of the present invention is the identification of process problems which caused defects in the manufacture of a TFT array. An exemplary embodiment of the method of the present invention adapted to perform this application will now be discussed.

Classification of TFT-Array Defects and Identification of Associated Manufacturing Process Problems As previously described, TFT-arrays are typically used in LCD display panels. In order to ensure their proper operation, the arrays should be tested before being sold. Testing is preferably performed by the manufacturer using equipment which drives the array with a pattern of electrical signals. During this testing process, the storage capacitor of each pixel experiences electrical charging and discharging operations. A sensor measures these voltages and then they are compared to predetermined target voltages which non-defective pixels would exhibit. If a pixel has a defect, its corresponding pixel voltage will be different from a target pixel voltage. Thus, when a difference exists between the measured voltage and this normal voltage, the pixel under test may be considered to have a defect.

During the manufacturing process, many types of defects may form in a TFT array. These defects include but are not limited to data line open, gate line open, common line open, local drain electrode open, local source electrode open, local gate electrode open, local gate-drain short, local gate-source short, local drain-source short, ITO pixel electrode-gate line short, ITO pixel electrode-data line short, Cst (storage capacitor) short through the insulator, pinhole in gate insulator, Gate-data line short, data-common line short, local semiconductor island missing, local contact layer (such as n+ layer) absence, damaged Cst electrode, data-data line short, local n+ layer short, ITO-ITO short over data line, ITO-ITO short over gate line, ITO pixel electrode absence, overlap between data line and ITO pixel electrode, and overlap between gate line and ITO pixel electrode.

In accordance with this exemplary embodiment of the present invention, it may be assumed that each type of defect that can occur in a TFT array has its own unique defect signal profile. A list of predefined defect types may therefore be developed and stored in association with their unique signal profiles for purposes of defect classification. During testing, a pixel voltage corresponding to a defective pixel may be identified as corresponding to one of the predefined defect types, by matching the pixel voltage to one of the unique signal profiles.

As previously indicated, FIG. 13 shows an example of a defect histogram based on an ideal distribution of defect signals Vd1, Vd2, and Vdn for predefined defect types d1, d2, and dn and their defect signal zones due to measurement noise. The vertical axis in this graph is labeled "number of defects collected over time" because the graph of FIG. 13 is a histogram, which, for example, may be generated for currently running tests indicating a total number of times the defect signals for defect types d1, d2 and dn have occurred during production tests over a period of time. For ideal distribution of the defect signals, previous tests or circuit simulation give Vd1, Vd2 and Vdn.

Actual defective pixel voltages are influenced by their defect severity and location, in addition to the noise generated from the test equipment. Varying degrees of defect severity and signal delay due to different defect location cause the pixel voltages produced from defective pixels to further deviate from their ideal form. Defect signals for defects d1, d2, and dn that are produced from those additional non-ideal factors and noise may be shown, for example, in FIG. 14. Because all those combined non-ideal factors can skew the defect signals to values greater or less than the ideal values of Vd1, Vd2, and Vdn as shown in FIG. 13, the signal profiles of the defect signals in FIG. 14 are shown as statistical curves with predetermined standard deviations.

Because of the occurrence of the non-ideal factors during the testing process, ambiguities are introduced into the system. These ambiguities can corrupt the defect classification process if left unabated. The present invention may take a variety of approaches to accurately classify defective pixel voltages produced by defects in an array which contains non-ideal factors. One approach involves identifying which defect signal profile (e.g., d1, d2, dn) most closely matches the defect signal of a defective pixel. The predefined defect type corresponding to this signal profile may then be used as a basis for classifying the detected defect. This approach, however, may not be optimal when the defect signal of detected defective pixel falls within the signal profiles of two predefined types of defects.

When the defect signal of a detected pixel voltage falls within the defect signal profile of two or more predefined types of defects, the present invention may employ probabilistic techniques to identify the most likely defect type. One such technique is based on the recognition that for some mask and process designs, the probability of one type of defect occurring may be very low if one or more other types process problems are not found to simultaneously exist. In such a case, the low-probability defect type may be excluded from the list of defect classifications, favoring instead another closely matching defect type with higher probability.

Determination of Parameter Values. As the display size of a TFT-array panel increases, the test equipment may take multiple measurements to test the panel. This is because the measurement sensor of the array tester cannot cover the entire panel size. Only one portion of the panel may be tested at a time. Thus, for large displays multiple measurements are performed for one TFT-array panel and a stepping motion is required between the sensor and the panel. Because of environmental changes and other influences, the detected pixel voltage distribution may change with every new measurement after stepping. The defect signals for each predefined defect type may therefore be expected to change from panel-to-panel and from step-to-step. In accordance with the present invention, these values may be periodically adjusted, e.g., with every measurement.

One way to properly adjust the representative defect signal of each predefined defect type is to use a measured mean value of normal pixel voltages. For example, if the representative defect signal of defect type d1 is Vd1i at initial mean value of Vmi_d1, then an adjusted defect signal for a new measurement with new mean value of Vmn_d1 can be obtained by Equation 1.

$$Vd1n = Vd1i * Vmn\_d1 / Vmi\_d1 \tag{1}$$

This equation can be used because it can be assumed that the change in voltage measurement is linear to normal pixel voltage and the defect pixel voltage, and this makes the defect signal also change linearly. The mean value of normal pixel voltages are normally available from TFT-array test equipment at every new measurement.

The value of Vd1i may also change at different pixel locations because of varying amounts of signal delay depending on the pixel location. In these circumstances, the value of Vd1i at each pixel location may be adjusted through a combination of computer simulation techniques performed for the array and a small number of defect signal measurements. If a signal profile for one of the predefined defect types cannot be adjusted in a manner which distinguishes it from the signal profiles of other predefined defect types, then it may be discarded.

Defect Classification with Distribution of Defect Signal. In general, the defect signal of a predefined defect type may have a statistical distribution as shown in FIG. 14 and can be represented by normal distribution function as follows, $$\Theta di = N_{di} exp[-(v-V_{di})^2/(2\sigma_{di}^2)]/\sqrt{2\pi\sigma_{di}^2} \tag{2}$$

where Θdi represents the distribution function of defect signal of predefined defect type di at specific measurement, v is a variable of defect signal, $V_{di}$ is a mean value and $\sigma_{di}$ is a standard deviation of normal distribution function for predefined defect signals of type di, and $N_{di}$ is the probability of any arbitrary defect to be originated from the predefined defect type di.

Thus, one can expect $$\sum_{i=1}^{k} N_{di} = 1 \tag{3}$$

where k denotes the total number of predefined defect types.

The value of $N_{di}$ may be determined by objectively considering how probable it is that each predefined defect type can take place. If every predefined defect type has equal probability, then one can obtain from Equation (3) that every $N_d$ is equal to 1/k. The value of $\sigma_{di}$ can depend on the process variation related to the predefined defect type and the noise of the measurement system.

The defect signal zones for the predefined defect types should then be redefined by adjusting the dividing lines to give the same amount of error for two neighboring signal profile distributions. In FIG. 14, the dividing line $D_{2n}$ between the defect signal zone for d2 and dn is determined so that the area under the tailed distribution of d2 to the right of $D_{2n}$ is equal to the area under the tailed distribution of dn to the left of $D_{2n}$. Applying this concept to Eq. (2), one obtains following expression $$\int_{v=D2n}^{\infty} \left\{ N_{d2} \exp[-(v-V_{d2})^2/(2\sigma_{d2}^2)] \Big/ \sqrt{2\pi\sigma_{d2}^2} \right\} dv = \int_{v=-\infty}^{D2n} \left\{ N_{dn} \exp[-(v-V_{dn})^2/(2\sigma_{dn}^2)] \Big/ \sqrt{2\pi\sigma_{dn}^2} \right\} dv$$

Setting the dividing line in this manner produces the same amount of error for purposes of classifying a detected voltage of a defective pixel within the signal zones for two neighboring predefined defect types. As a result, this error is cancelled out when the information of defect classification is collected for many data.

Another way to classify each defect between two neighboring predefined defect types is to use Bayes' Theorem and the probability that each defect originated from a predefined defect type d1, when the defect signal Vd falls between Vd1 and Vd2. This is given by Equation (5) as follows:

$$P(D_1|E)=P(D_1)*P(E|D_1)/\{P(D_1)*P(E|D_1)+P(D_2)*P(E|D_2)\} \quad (5)$$

where $P(D_1|E)$ is the probability that a detected pixel voltage Vd between Vd1 and Vd2 corresponds to predefined defect type d1, $P(D_1)$ is the probability that any defect corresponds to predefined defect type d1, $P(E|D_1)$ is the probability of defect occurring as a member of d1, $P(D_2)$ is the probability of any defect corresponding to predefined defect type d2, and $P(E|D_2)$ is the probability of a defect occurring as a member of d2.

If Equations (2) and (5) are compared, the following equations can be obtained $$P(D_1)*P(E|D_1)=\alpha N_{d1}exp[-(Vd-V_{d1})^2/(2\sigma_{d1}^2)]/\sqrt{2\pi\sigma_{d1}^2} \quad (6)$$

$$P(D_2)*P(E|D_2)=\alpha N_{d2}exp[-(Vd-V_{d2})^2/(2\sigma_{d2}^2)]/\sqrt{2\pi\sigma_{d2}^2} \quad (7)$$

where α is a proportional constant.

From Equations (5), (6), and (7), the following equation may be obtained:

$$P(D_1|E)=[N_{d1}exp[-(Vd-V_{d1})^2/(2\sigma_{d1}^2)]/\sqrt{2\pi\sigma_{d1}^2}]/\{N_{d1}exp[-(Vd-V_{d1})^2/(2\sigma_{d1}^2)]/\sqrt{2\pi\sigma_{d1}^2}+N_{d2}exp[-(Vd-V_{d2})^2/(2\sigma_{d2}^2)]/\sqrt{2\pi\sigma_{d2}^2}\} \quad (8)$$

If the defect signal profiles for some of the predefined defect types have broad statistical distributions, then statistical distributions for other predefined defect types beyond the two neighboring distributions should be taken into consideration. This may be accomplished by generalizing Equations (5) and (8) as $$P(D_1 \mid E) = P(D_1) * P(E \mid D_1) \Big/ \sum_{j=1}^{k} \{P(D_j) * P(E \mid D_j)\} \quad (9)$$

$$P(D_1 \mid E) = \left[N_{dI} \exp[-(Vd - V_{dI})^2 / (2\sigma_{dI}^2)] \Big/ \sqrt{2\pi\sigma_{dI}^2}\,\right] \Big/ \sum_{j=1}^{k} \left\{N_{dj} \exp[-(Vd - V_{dj})^2 / (2\sigma_{dj}^2)] \Big/ \sqrt{2\pi\sigma_{dj}^2}\right\} \quad (10)$$

Defect Classifications with Exceptional Defects. Some defect types reveal their classification in a clearer way than other types. For example, defect types such as line open or line short defects show the defect classification as soon as they are detected. An ITO-ITO short defect can be classified when detected defect signals for two adjacent pixels show very close values, because these defects have practically the same pixel voltage. For these exceptional defects, defect classification is rather straightforward and precedes the procedure explained in previous sections.

Defect Classification with Input from Array Repair. The defects in a TFT-array panel, detected by TFT-array test equipment, can be reviewed by an operator under a microscope. During this examination, the operator first may try to identify the defect and then repair the defect according to the result of the visual defect identification. Thus, based on the visual defect identification, the operator of TFT-array repair equipment can add more valuable information to the effort of defect classification. For example, using the defect classification described in previous sections, one can provide multiple choices with priority for the cause of the defect and help the operator of TFT-array repair equipment choose one cause of the defect out of the multiple choices. Then, one can use the operator's choice as a final decision in defect classification.

Conversion of Defect Classification into Process Problems. Once a detected pixel voltage has been classified as corresponding to one of the plurality of predefined defect types, a determination is made as to what anomaly in the manufacturing process may have been the cause of the defect. This determination may be made based on data collected from previous tests linking the predefined types of defects to specific process problems. Linking this information requires a thorough understanding of the mask design and manufacturing process for TFT-arrays. This may be accomplished manually based on the expertise of an engineer or automatically, for example, through the use of a rules-based system. Table 1 shows an example of how various predefined defect type classifications may be converted into process problems.

TABLE 1

| Defect | Process Problem Description | |
|---|---|---|
| Classification | Major Process Area | Detailed Description |
| Data line open | Source/Drain line patterning | Foreign particle on the substrate before S/D metal film deposition |
| Gate line open | Gate line patterning | Foreign particle on the substrate before gate metal film deposition |
| Common line open | Gate line patterning | Foreign particle on the substrate before gate metal film deposition |
| Local drain electrode open | Source/Drain line patterning | Foreign particle on the substrate before S/D metal film deposition |
| Local source electrode open | Source/Drain line patterning | Foreign particle on the substrate before S/D metal film deposition |
| Local gate electrode open | Gate line patterning | Foreign particle on the substrate before gate metal film deposition |
| Local gate - drain short | Cleaning after gate line patterning and before gate insulator film deposition | Foreign particle on the substrate before gate insulator film deposition |
| Local gate - source short | Cleaning after gate line patterning and before gate insulator film deposition | Foreign particle on the substrate before gate insulator film deposition |
| Local drain - source short | Source/Drain line patterning | Foreign particle on the PR (photoresist) coated substrate before exposure for S/D line patterning |
| ITO pixel electrode - gate line short | Cleaning after gate line patterning and before gate insulator film deposition and ITO patterning | Foreign particle on the substrate before gate insulator film deposition and on the PR coated substrate before exposure for ITO patterning |
| ITO pixel electrode - data line short | Cleaning after data line patterning and before passivation insulator film deposition and ITO patterning | Foreign particle on the substrate before passivation insulator film deposition and on the PR coated substrate before exposure for ITO patterning |
| Cst short through the insulator | Cleaning after gate line patterning and before gate insulator film deposition | Foreign particle on the substrate before gate insulator film deposition |
| Pinhole in gate insulator | Cleaning after gate line patterning and before gate insulator film deposition | Foreign particle on the substrate before gate insulator film deposition |
| Gate - data line short | Cleaning after gate line patterning and before gate insulator film deposition | Foreign particle on the substrate before gate insulator film deposition |
| Data - common line short | Cleaning after gate line patterning and before gate insulator film deposition | Foreign particle on the substrate before gate insulator film deposition |
| Local semiconductor island missing | Semiconductor island patterning | Foreign particle on the substrate before semiconductor film deposition |

TABLE 1-continued

| Defect | Process Problem Description | |
|---|---|---|
| Classification | Major Process Area | Detailed Description |
| Local contact layer absence | Contact layer patterning | Foreign particle on the substrate before contact layer film deposition |
| Damaged Cst electrode | Either gate line patterning or ITO patterning | Foreign particle on the substrate before gate metal or ITO film deposition |
| Data - data line short | Source/Drain line patterning | Foreign particle on the PR coated substrate before exposure for S/D line patterning |
| Local n+ layer short | Etching of n+ layer | Foreign particle on the substrate before n+ layer etching |
| ITO - ITO short over data line | ITO patterning | Foreign particle on the PR coated substrate before exposure for ITO patterning |
| ITO - ITO short over gate line | ITO patterning | Foreign particle on the PR coated substrate before exposure for ITO patterning |
| ITO pixel electrode absence | ITO patterning | Foreign particle on the substrate before ITO film deposition |
| Overlap between data line and ITO pixel electrode | Either data line patterning or ITO patterning | Foreign particle on the PR coated substrate before exposure for data line patterning or ITO patterning |
| Overlap between gate line and ITO pixel electrode | Either gate line patterning or ITO patterning | Foreign particle on the PR coated substrate before exposure for gate line patterning or ITO patterning |

As seen in the Table 1, some of the defect classifications share the same process problems and defect type classifications such as ITO pixel electrode-gate line short and ITO pixel electrode-data line short are related to multiple process problems. The information from Table 1 was derived for a 5-mask design and common Cst structure such as shown in FIGS. 1(*a*) and 15.

Figure 15:
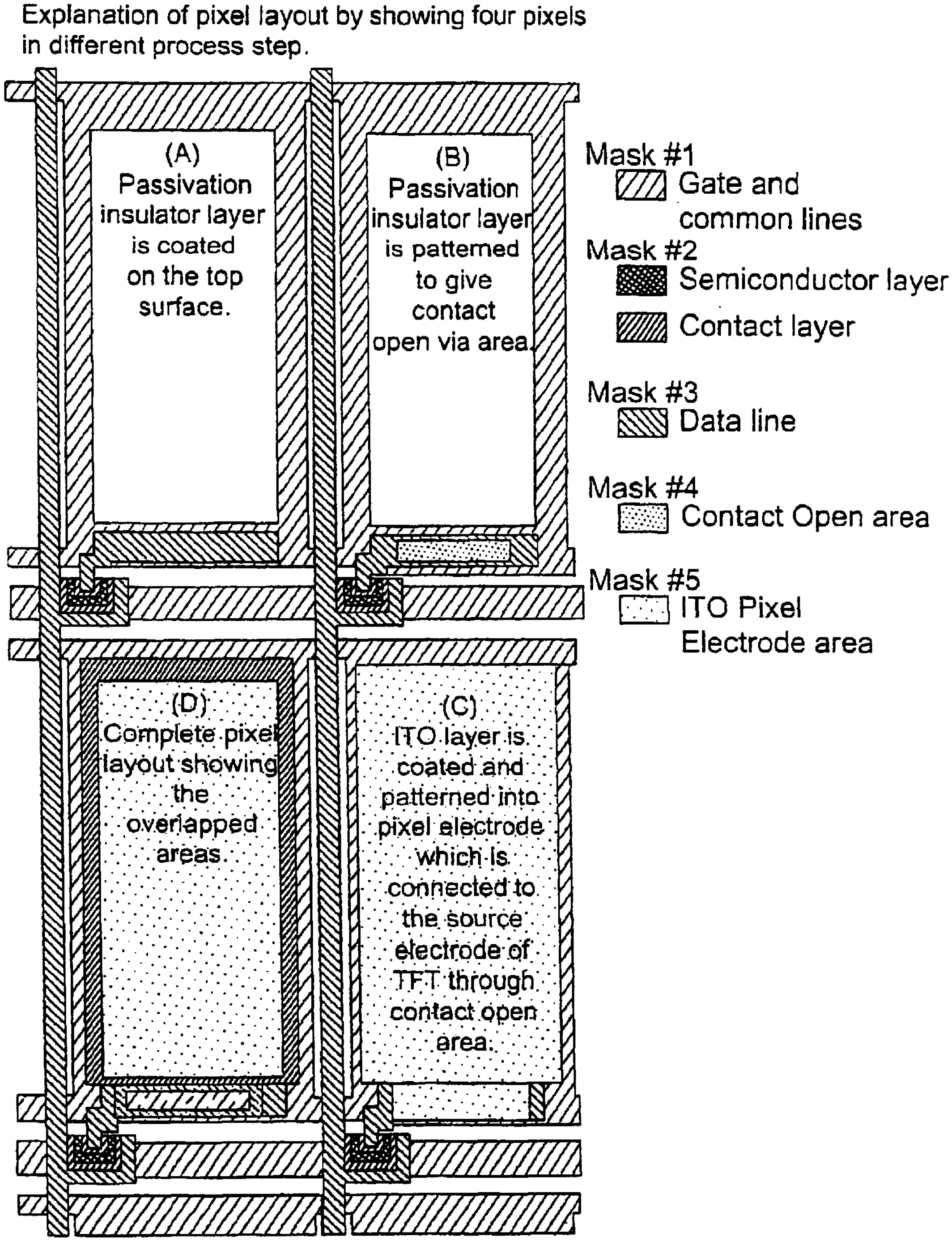
FIG. 15 is a diagram showing a portion of a TFT array used in a display panel which may be tested in accordance with the method of the present invention.
Figure 16:
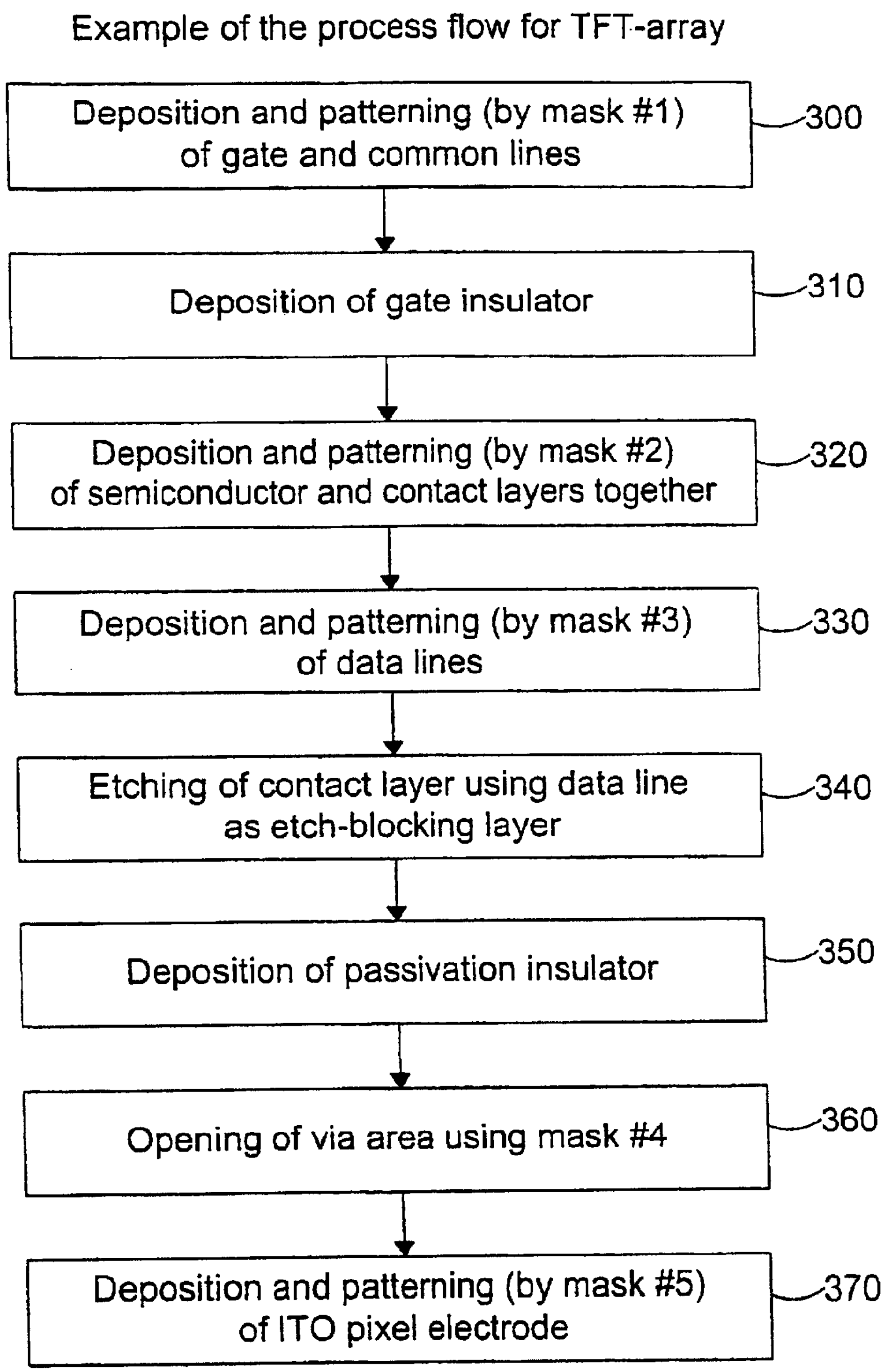
FIG. 16 is a flow diagram showing steps included in a process for manufacturing a TFT array as shown in FIG. 15.

FIG. 16 is a flowing diagram showing steps included in a process for manufacturing the TFT-array structure show in FIG. 15. An initial step includes depositing and patterning gate and common lines using a first mask. (Block 300). A gate insulator layer is then deposited (Block 310), followed by the deposition and patterning of semiconductor and contact layers using a second mask (Block 320). Next, data lines are deposited and patterned using a third mask. (Block 330), the contact layers are etched using the data lines as an etch-blocking layer (Block 340), and a passivation insulator is deposited (Block 350). Using a fourth mask, a via area is opened (Block 360) and then an ITO pixel electrode is deposited and etched (Block 370). Through the method of the present invention, defects detected in the TFT array may be classified. Then, based on this classification, for example, through the use of Table 1, the cause of each defect may then be identified as corresponding to one or more problems that occurred during the various stages of the manufacturing process. The existence of these defects may then be fed back to an operator or control system and appropriate action may be taken to prevent the defect from arising in subsequently manufactured arrays, e.g., a foreign particle which caused an ITO-ITO short over a gate line may be removed.

A system for classifying defects in a circuit under test and then determining one or more process problems which caused the defect may correspond to the tester shown in FIG. 11. In this system, signal generator 80 inputs test signals and processor/detector 90 detects signals generated at predetermined locations within the circuit. The processor then performs steps analogous to those included in the method of the present invention, for example, under control of a computer program to perform defect classification and process problem identification.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

I claim:

1. A method for performing defect analysis, comprising:

applying a test signal to a circuit;

obtaining a signal generated in response to the test signal;

comparing the response signal to reference information;

classifying a defect in the circuit based on a result of the comparing step; and identifying a problem in a manufacturing process which caused the defect based on said defect classification, wherein the problem in the manufacturing process is identified by;

comparing the defect classification to statistical information which links a plurality of predefined defect classifications to a plurality of corresponding manufacturing process problems.

2. The method of claim 1, wherein the reference information includes a signal profile of a type of defect that can occur during the manufacturing process.

3. The method of claim 2, further comprising:

forming the signal profile from defect signals generated from previous tests of circuits that correspond to said type of defect.

4. The method of claim 3, wherein the signal profile is a statistical representation of the defect signals from said previous tests.

5. The method of claim 2, further comprising:

computing a mean of signal values for a non-defective circuit; and forming the signal profile of said type of defect based on the computed mean value.

6. The method of claim 2, wherein said classifying step includes:

determining that the circuit has said type of defect if the response signal falls within the signal profile.

7. The method of claim 1, further comprising:

storing, in a memory, information linking a plurality of defect classifications with a respective plurality of manufacturing process problems, said identifying step including identifying said manufacturing process problem based on said linking information.

8. The method of claim 1, further comprising:

identifying an area within said manufacturing process where the classified defect occurred.

9. The method of claim 1, further comprising:

adjusting said process to avoid the problem during manufacture of other circuits.

10. The method of claim 1, wherein the reference information includes a plurality of signal profiles corresponding to different types of defects that can occur during the manufacturing process.

11. The method of claim 10, wherein the classifying step includes:

determining that a signal profile which closely matches the response signal; and determining that the circuit includes the defect corresponding to the signal profile.

12. The method of claim 11, wherein the signal profile is determined to closely match the response signal when the response signal lies within the signal profile.

13. The method of claim 10, wherein the classifying step includes:

determining that the response signal falls within two signal profiles;

determining that one of the two profiles has a higher probability of occurrence; and determining that the circuit includes the defect which corresponds to the profile having the higher probability of occurrence.

14. The method of claim 13, further comprising:

determining that the other one of the two profiles has a lower probability of occurrence based on an absence of detection of one or more other types of defects in the circuit.

15. The method of claim 13, further comprising:

determining that the other one of the two profiles has a lower probability of occurrence based on an absence of detection of one or more predetermined manufacturing process problems.

16. The method of claim 10, wherein the signal profiles are included in respective signal zones, said zones including ranges of signal values which respectively correspond to the different types of defects.

17. The method of claim 16, wherein the classifying step includes:

determining a signal profile range that includes the response signal; and determining that the electrical circuit includes the defect that corresponds to the signal profile range which includes the response signal.

18. The method of claim 17, wherein the classifying step includes:

determining that the response signal lies within two signal profile ranges; and selecting the defect that corresponds to the signal profile range having a greater probability of occurrence.

19. The method of claim 18, wherein the greater probability of occurrence is determined based on Bayes' Theorem.

20. The method of claim 16, further comprising:

locating an intersection between adjacent signal profiles; and adjusting a position of a dividing line between signal zones corresponding to said adjacent profiles so that the error distribution of the adjacent signal profiles is at least substantially equal.

21. The method of claim 16, further comprising:

positioning a dividing line between adjacent signal zones based on an intersection between curves included in the signal zones.

22. The method of claim 1, further comprising:

determining in what stage of the manufacturing process the defect occurred.

23. The method of claim 1, further comprising:

determining a technique for correcting the defect classification based on the identified manufacturing process problem.

24. A method for performing defect analysis, comprising:

detecting a pixel voltage output from a TFT array in response to a test signal;

comparing the pixel voltage to at least one defect signal;

classifying a defect in the array based on a result of the comparing step; and identifying a manufacturing process problem which caused the defect based on said defect classification, wherein the problem in the manufacturing process is identified by;

comparing the defect classification to statistical information which links a plurality of predefined defect classifications to a plurality of corresponding manufacturing process problems.

25. The method of claim 24, wherein the defect signal corresponds to a predefined type of defect.

26. The method of claim 25, further comprising:

forming the defect signal from previous test data.

27. The method of claim 25, wherein the defect signal includes a curve located within a signal zone corresponding to said predefined type of defect.

28. The method of claim 27, wherein the classifying step includes determining whether the pixel voltage falls within the curve of the defect signal.

29. The method of claim 24, further comprising:

comparing the pixel voltage to a plurality defect signals each corresponding to a different type of defect, said classifying step including determining that the pixel voltage at least substantially matches at least one of the defect signals.

30. The method of claim 29, further comprising:

storing information linking the different defect types to manufacturing process problems, said identifying step including identifying said manufacturing process problem based on said linking information.

31. The method of claim 24, further comprising:

identifying an area within said manufacturing process where the classified defect occurred.

32. The method of claim 24, further comprising:

determining in what stage of the manufacturing process the defect occurred.

33. The method of claim 24, further comprising:

determining a technique for correcting the defect classification based on the identified manufacturing process problem.

34. A system for performing defect analysis, comprising:

a signal generator which applies a test signal to a circuit;

a detector which obtains a signal generated in response to the test signal; and a processor which compares the response signal to reference information, classifies a defect in the circuit based on a result of the comparison, and identifies a problem in a manufacturing process which caused the defect based on said defect classification, wherein the processor identifies the problem in the manufacturing process by;

comparing the defect classification to statistical information which links a plurality of predefined defect classifications to a plurality of corresponding manufacturing process problems.

35. The system of claim 34, wherein the reference information includes a signal profile of a type of defect that can occur during the manufacturing process.

36. The system of claim 35, wherein the processor classifies the defect by determining whether the response signal falls within said signal profile.

37. The system of claim 35, wherein the signal profile is generated based on previous test data.

38. The system of claim 37, wherein the signal profile is a statistical representation of the defect signals from said previous tests.

39. The system of claim 34, further comprising:

a memory which stores information linking a plurality of defect classifications with a respective plurality of manufacturing process problems, said processor identifying the manufacturing process problem based on said linking information.

40. The system of claim 34, wherein the processor identifies an area within said manufacturing process where the classified defect occurred.

41. The system of claim 34, wherein the processor determines in what stage of the manufacturing process the defect occurred.

42. The system of claim 34, wherein the processor determines a technique for correcting the defect classification based on the identified manufacturing process problem.

43. A method for performing defect analysis, comprising:

detecting a pixel voltage output from a TFT array in response to a test signal;

comparing the pixel voltage to at least one defect signal;

classifying a defect in the array based on a result of the comparing step; and identifying a manufacturing process problem which caused the defect based on said defect classification, wherein the problem in the manufacturing process is automatically identified using a rules-based or knowledge-based system that associates the defect classification with one or more other defects that are likely to occur together.

44. A method for performing defect analysis, comprising:

applying a test signal to a circuit;

obtaining a signal generated in response to the test signal;

comparing the response signal to reference information;

classifying a defect in the circuit based on a result of the comparing step; and identifying a problem in a manufacturing process which caused the defect based on said defect classification, wherein the problem in the manufacturing process is automatically identified using a rules-based or knowledge-based system that associates the defect classification with one or more other defects that are likely to occur together.

45. A system for performing defect analysis, comprising:

a signal generator which applies a test signal to a circuit;

a detector which obtains a signal generated in response to the test signal; and a processor which compares the response signal to reference information, classifies a defect in the circuit based on a result of the comparison, and identifies a problem in a manufacturing process which caused the defect based on said defect classification, wherein the processor determines the problem in the manufacturing process by referencing a rules-based or knowledge-based system that automatically associates the defect classification with one or more other defects that are likely to occur together.

* * * * *